United States Patent
Ideuchi et al.

(10) Patent No.: US 9,906,238 B2
(45) Date of Patent: Feb. 27, 2018

(54) ENCODING DEVICE, ENCODING METHOD AND SEARCH METHOD

(71) Applicant: FUJITSU LIMITED, Kawasaki-shi, Kanagawa (JP)

(72) Inventors: Masao Ideuchi, Hachioji (JP); Seiji Okura, Meguro (JP); Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/654,984

(22) Filed: Jul. 20, 2017

(65) Prior Publication Data
US 2018/0026650 A1    Jan. 25, 2018

(30) Foreign Application Priority Data

Jul. 25, 2016  (JP) .................................. 2016-145779

(51) Int. Cl.
*H03M 7/00* (2006.01)
*H03M 7/30* (2006.01)
(Continued)

(52) U.S. Cl.
CPC ............ *H03M 7/30* (2013.01); *G06F 17/227* (2013.01); *G06F 17/271* (2013.01); *G06F 17/2755* (2013.01); *G06F 17/2785* (2013.01)

(58) Field of Classification Search
CPC . H03M 7/30; H03M 7/00; H03M 5/00; G06F 17/227; G06F 17/2785; G06F 17/2755
(Continued)

(56) References Cited

U.S. PATENT DOCUMENTS

| 5,614,899 A | 3/1997 | Tokuda et al. |
| 5,873,056 A * | 2/1999 | Liddy .................. G06F 17/274 704/9 |

(Continued)

FOREIGN PATENT DOCUMENTS

| JP | 7-129588 | 5/1995 |
| JP | 7-160684 | 6/1995 |

(Continued)

OTHER PUBLICATIONS

European Search Report dated Jan. 3, 2018 in European Application No. 17182307.3 (English).

(Continued)

*Primary Examiner* — Jean B Jeanglaude
(74) *Attorney, Agent, or Firm* — Oblon, McClelland, Maier & Neustadt, L.L.P.

(57) ABSTRACT

A recording medium having stored therein an encoding program that causes a computer to execute a process, the process including first generating a plurality of word codes by assigning a compression code to each of a plurality of words contained in a sentence in a compression target document, second generating a plurality of pieces of semantic structure information respectively corresponding to the plurality of words by performing a semantic analysis of the sentence, third generating a plurality of semantic structure codes by assigning each of the plurality of compression codes to corresponding semantic structure information, and outputting the plurality of word codes and the plurality of semantic structure codes with a specific order.

12 Claims, 33 Drawing Sheets

(51) Int. Cl.
*G06F 17/22* (2006.01)
*G06F 17/27* (2006.01)

(58) Field of Classification Search
USPC ...................................... 341/50, 51, 107, 87
See application file for complete search history.

(56) References Cited

U.S. PATENT DOCUMENTS

| | | | |
|---|---|---|---|
| 5,991,713 | A | 11/1999 | Unger et al. |
| 6,965,857 | B1 * | 11/2005 | Decary ............... G06F 17/2705 704/1 |
| 7,013,425 | B2 * | 3/2006 | Kataoka .............. G06F 17/2247 715/242 |
| 7,880,648 | B2 * | 2/2011 | Kataoka .................. H03M 7/40 341/107 |
| 9,509,334 | B2 * | 11/2016 | Kataoka .............. H03M 7/3084 |
| 9,665,565 | B2 * | 5/2017 | Ma ...................... G06F 17/2785 |
| 2008/0189269 | A1 | 8/2008 | Olsen |
| 2016/0210508 | A1 * | 7/2016 | Ideuchi ................... G06F 17/22 |
| 2016/0217207 | A1 * | 7/2016 | Okura ............... G06F 17/30684 |

FOREIGN PATENT DOCUMENTS

| | | |
|---|---|---|
| JP | 2008-135023 | 6/2008 |
| JP | 2013-190985 A | 9/2013 |

OTHER PUBLICATIONS

Sebastian Maneth et al., "A Survey on Methods and Systems for Graph Compression", Apr. 2, 2015, pp. 1-15, XP055435280. Retrieved from the Internet: URL:https://arxiv.org/pdf/1504.00616.pdf.

\* cited by examiner

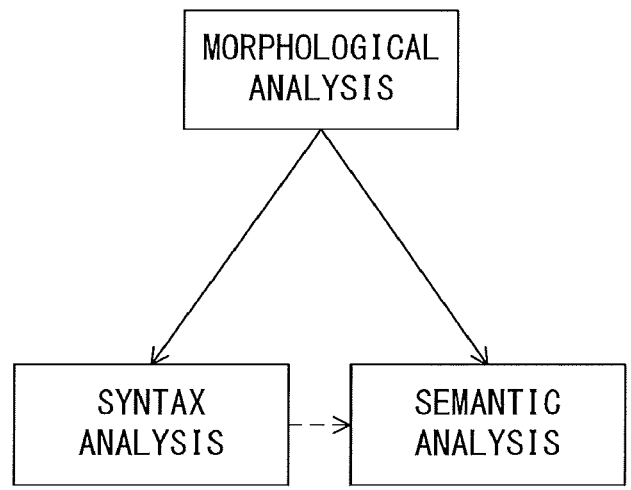
F I G. 1

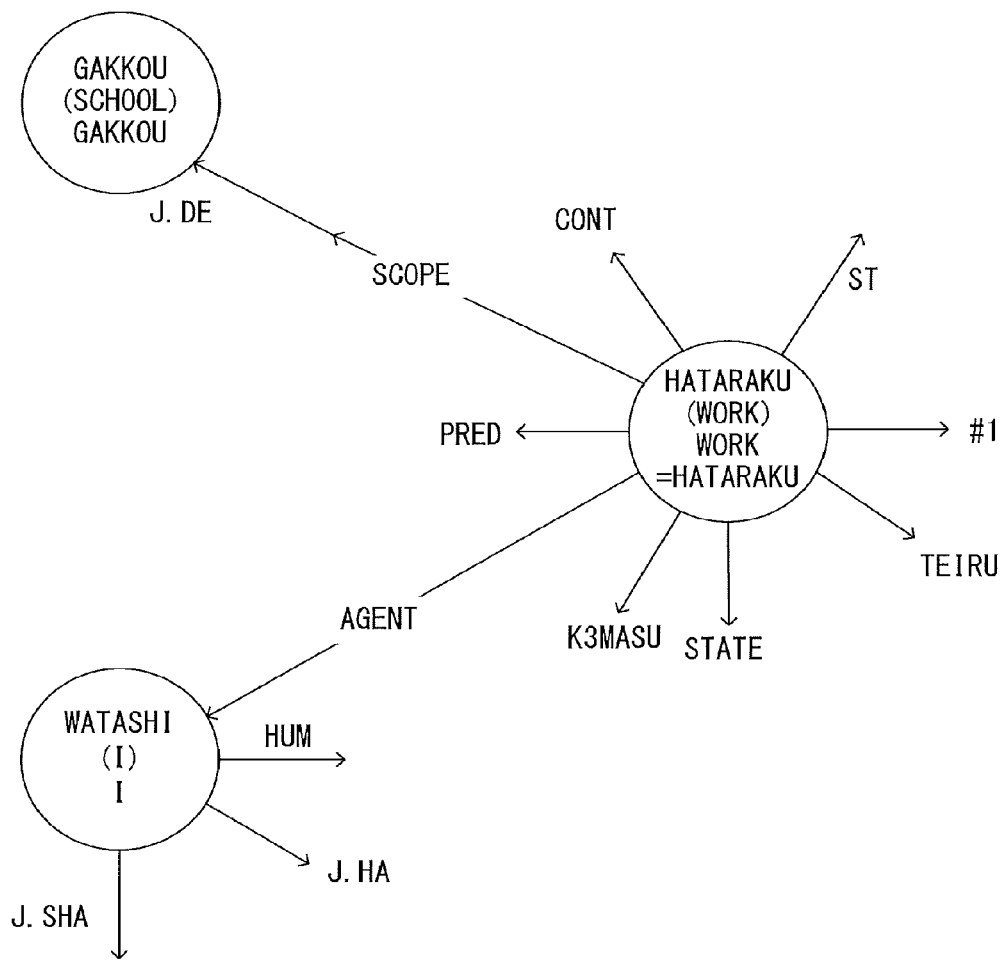
F I G. 2

■ eld
■ par
■  An
■ us(
■ August 2
■ 3,
■ ).
■ An
■ pla
■ nation
■ of the
■ lat
■  Algorithm
■ ".
■ comp

F I G. 4

- compression.
- .z
- zli
- ib
- b.
- .n
- net
- t.
-  htt
- tp://
- /www
- w.
- .z
- zlib
- b.n

F I G. 5

| WORD ID | WORD | ADDITIONAL INFORMATION | ... |
|---------|------|------------------------|-----|
| 1 | SAKURA | NOUN | ... |
| 2 | GAKKOU | NOUN | ... |
| 3 | NO | POSTPOSITION | ... |
| ⋮ | ⋮ | ⋮ | ⋮ |

FIG. 10

■EXAMPLES OF CONCEPT INFORMATION OF WORDS
- ADJ
- ADV
- ADVN
- ADVP
- N
  ⋮

■EXAMPLES OF ARCS
- \<ST\>
- \<AGENT\>
- \<QUOTE\>
- \<REASON\>
- \<REL\>
- \<RENGO\>
  ⋮

F I G. 1 2

| ID | COMPRESSION CODE |
|---|---|
| 1 | C01234h |
| 2 | C02123h |
| 3 | C00101h |
| ⋮ | |

F I G. 16

| WORK=HATARAKU | I | ... | ST | AGENT | ... | CHILD BINARY TREE |
|---|---|---|---|---|---|---|
| 0xAAA | 0x085 | ... | 0x001 | 0x0BC | ... | 0xF01~ |

F I G. 1 7

| ID | INTERMEDIATE CODE |
|---|---|
| 1 | C01234h |
| 2 | C02123h |
| 3 | C00101h |
| ⋮ | |

FIG. 23

| DOCUMENT ID | CONTENT |
|---|---|
| 1 | SAKURA GAKKOU NO... |
| 2 | KAEDE GAKKOU NO... |
| ⋮ | |

| DOCUMENT ID | SAKURA | KAEDE | GAKKOU | NO | ... | | | ... |
|---|---|---|---|---|---|---|---|---|
| 1 | 1 | 0 | 1 | 1 | | | | |
| 2 | 0 | 1 | 1 | 1 | | | | |
| ... | ... | ... | ... | ... | | | | |

| ID | INTERMEDIATE CODE | COMPRESSION CODE |
|---|---|---|
| 1 | C01234h | 010···011 |
| 2 | C02123h | 010···111 |
| 3 | C00101h | 011···01 |
| ⋮ | | |

FIG. 26

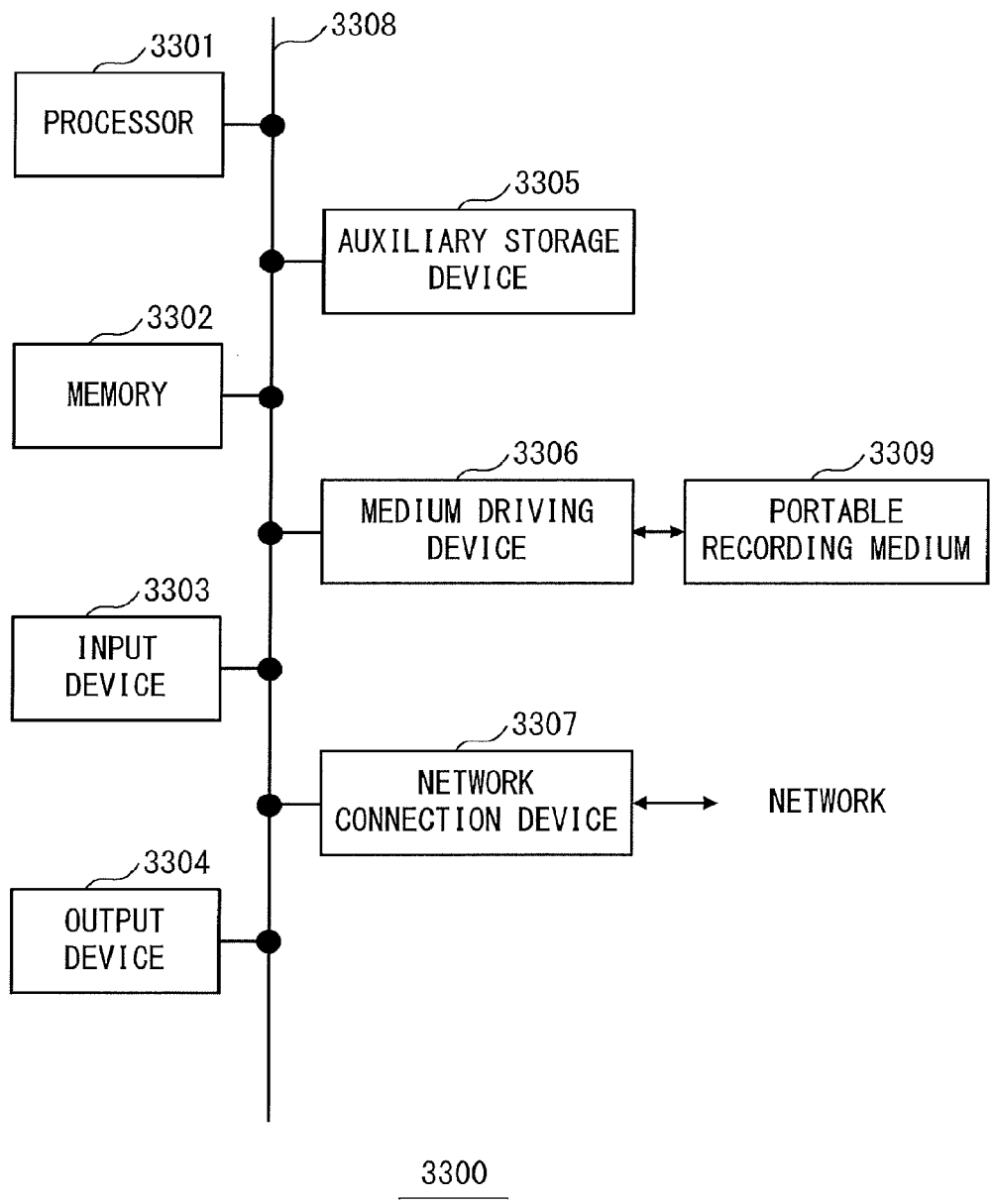
F I G. 33

ENCODING DEVICE, ENCODING METHOD AND SEARCH METHOD

CROSS-REFERENCE TO RELATED APPLICATION

This application is based upon and claims the benefit of priority of the prior Japanese Patent Application No. 2016-145779, filed on Jul. 25, 2016, the entire contents of which are incorporated herein by reference.

FIELD

The embodiments discussed herein are related to an encoding device, an encoding method and a search method.

BACKGROUND

FIG. 1 illustrates relationships between various types of text analyses that are performed on documents. Text analyses include for example a morphological analysis (part-of-speech analysis), a syntax analysis (modification analysis), and a semantic analysis. A morphological analysis is a process in which a sentence is segmented into morphemes so as to give part-of-speech information to each of the morphemes. Morphemes obtained in a morphological analysis may be treated as words in some cases. In a morphological analysis, a lexical analysis may be performed. A lexical analysis is a process in which a sentence is segmented into words in a document on the basis of notation.

A syntax analysis is a process in which phrases containing independent words are synthesized on the basis of part-of-speech information of words so as to obtain a modification relationship (qualification relationship) between phrases on the basis of independent words included in the phrases. Also, a semantic analysis is a process in which meaning relationships between words contained in sentences are analyzed on the basis of for example a modification relationship. A semantic analysis result can be used for a process of obtaining meaning of a synonymous expression and a polysemous expression or a process of extracting a word having a similar meaning from among a plurality of words. While a semantic analysis that does not aim at very high accuracy can be performed on the basis of words alone or on the basis of words and pieces of part-of-speech information, using modification relationships increases the accuracy of a semantic analysis. In a semantic analysis, part of the processes of a syntax analysis may be performed.

A semantic analysis uses a result of a morphological analysis of a natural sentence so as to obtain the semantic structure of that natural sentence. Using a semantic structure makes it possible to express, as data treated by computers, what a natural sentence means.

A semantic structure includes for example a plurality of nodes respectively representing the concepts of a plurality of words included in a morphological analysis result and directed arcs connected to the nodes. When an arc is connected to only one node, that arc represents the attribute of the node to which it is connected. Also, when an arc is connected to two nodes, that arc represents the relationship between the two nodes to which it is connected. In some cases, one node is connected to a plurality of arcs. A semantic structure is expressed by a graph structure (directed graph) that is created from for example nodes and arcs. FIG. 2 exemplifies a graph structure corresponding to a sentence of "WATASHI WA GAKKOU DE HATARAITE IMASU" ("I work for a school").

A semantic analysis defines structures on the basis of for example rules so as to perform an analysis while combining a plurality of structures as needed. An example of rules used by semantic analyses is case grammar, which is proposed by Fillmore. According to case grammar, a sentence for example is considered to consist of one verb and a plurality of case categories. For example, by repeatedly applying a rule as described, a graph structure, as illustrated in FIG. 2, that corresponds to one sentence can be generated eventually.

Also, FIG. 3 illustrates an example of a utilization process in which a text analysis result is utilized. A document 311 is compressed by using a compression dictionary 301, and is stored as a compressed document 312. Then, the compressed document 312 is decompressed for utilization so that the document 311 is restored, and a morphological analysis and a semantic analysis are performed on the document 311 by using an analysis dictionary 302 so as to generate a semantic analysis result 313. The semantic analysis result 313 is utilized by an application program etc.

Regarding this, a technique is known in which for example a document is rewritten so that the semantic contents will not be changed and document compression is performed by converting the document into bit strings while referring to a compression table after the rewriting (see Patent Document 1 for example). Also, a technique of obtaining a method of accessing and searching for information via a data communication system is known (see Patent Document 2 for example). A technique is also known that makes it possible to analyze document contents without preparing a dictionary for a natural language (see Patent Document 3 for example).

Patent Document 1: Japanese Laid-open Patent Publication No. 7-160684

Patent Document 2: Japanese Laid-open Patent Publication No. 2008-135023

Patent Document 3: Japanese Laid-open Patent Publication No. 7-129588

SUMMARY

According to an aspect of an embodiment, a recording medium is a non-transitory computer-readable recording medium having stored therein an encoding program for causing a computer to execute a process, the process including generating a plurality of word codes by assigning a compression code to each of a plurality of words contained in a sentence in a compression target document, generating a plurality of pieces of semantic structure information respectively corresponding to the plurality of words by performing a semantic analysis of the sentence, and generating a semantic structure code by assigning a compression code to each of the plurality of pieces of semantic structure information, and arranging the plurality of word codes and the plurality of semantic structure codes in a prescribed order so as to output the word codes and the semantic structure codes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 exemplifies relationships between various types of text analyses;

FIG. 2 exemplifies a graph structure;

FIG. 4 illustrates an example of a compression dictionary used in LZ77 encoding;

FIG. 5 illustrates an example of a compression dictionary used in LZ78 encoding;

FIG. 10 illustrates an example of a word dictionary;

FIG. 12 illustrates examples of pieces of concept information of words and examples of arcs;

FIG. 16 illustrates an example of a code table;

FIG. 17 exemplifies assignment of compression codes to semantic structure information and nested-structure information;

FIG. 23 illustrates an example of an intermediate code table;

FIG. 24 illustrates examples of a plurality of compression target documents;

FIG. 25 illustrates an example of aggregation information for a plurality of compression target documents;

FIG. 26 illustrates an example of a code table of compression codes;

FIG. 33 exemplifies a hardware configuration of an information processing apparatus that performs an encoding process or a utilization process according to embodiments;

DESCRIPTION OF EMBODIMENTS

Figure 3:
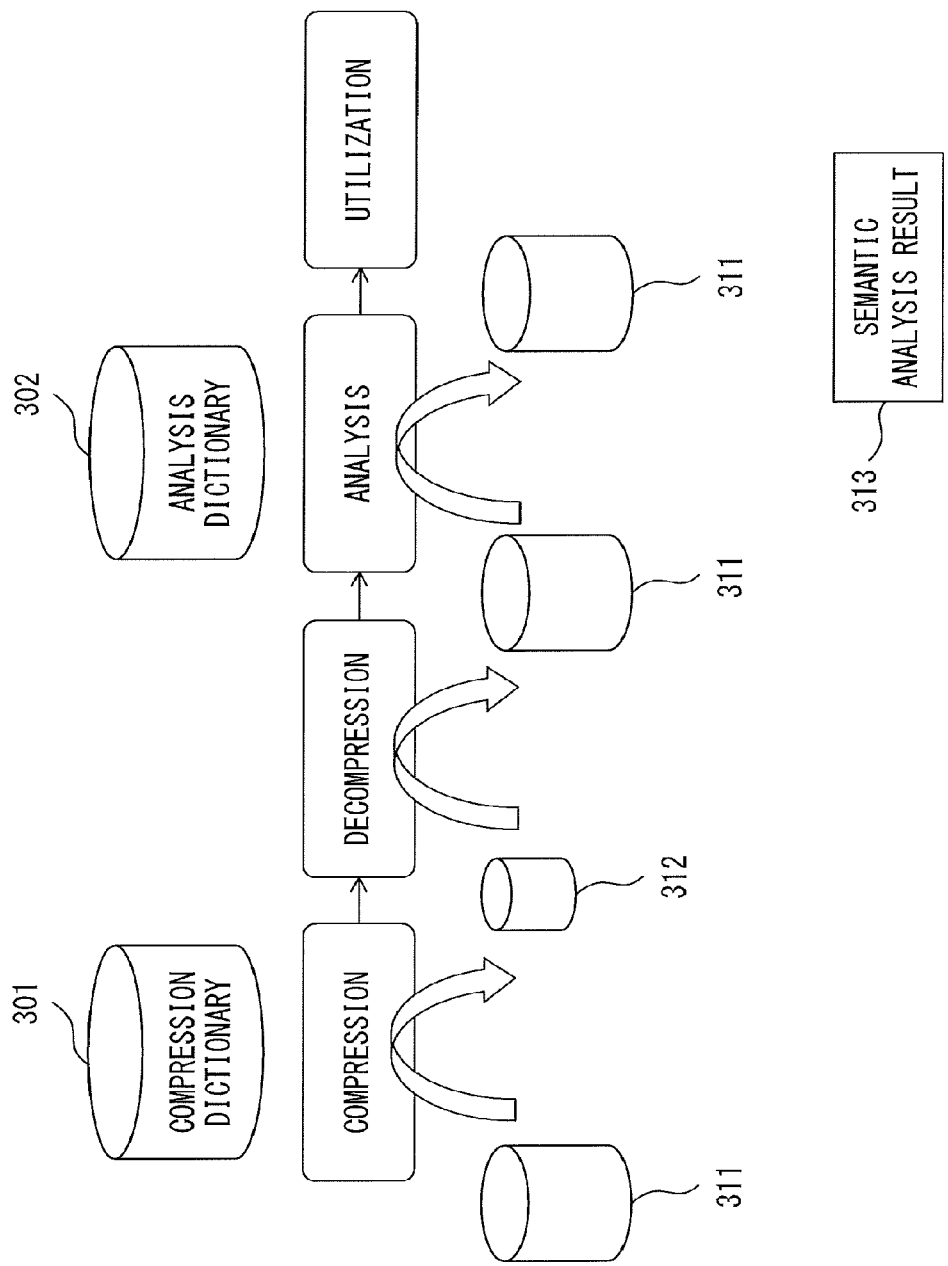
FIG. 3 illustrates an example of a utilization process in which a text analysis result is utilized.

Hereinafter, some embodiments of the present invention will be explained in detail by referring to the drawings. Note that elements corresponding to a plurality of drawings will be denoted by similar numerals.

In the utilization process illustrated in FIG. 3, a text analysis such as a morphological analysis, a semantic analysis, etc. is performed after decompressing a compressed document. Decompression of a compressed document to be utilized leads to large process loads. Also, a semantic analysis has individual applications executed independently for their purposes, which further increases process loads. An increase in process loads as described above more greatly affects an information processing apparatus that has a small amount of computation resources such as, in particular, a mobile terminal.

In view of this, it may be possible to employ an arrangement in which when a document is to be compressed in order to reduce loads of a utilization process of a semantic analysis result, a morphological analysis and a semantic analysis are performed in advance so as to obtain analysis results so as to store the analysis results in a compressed state. In such a case, a semantic analysis does not have to be performed for the utilization. However, a process of decompressing a compressed semantic analysis result is to be added. That is, the utilization of a semantic analysis result is possible after decompressing a compressed document and a compressed semantic analysis result and associating the decompressed document and the decompressed semantic analysis result. This means that the loads of a decompression process and an association process will not be reduced.

A compressed document and a compressed semantic analysis result are decompressed because a compression dictionary and analysis dictionary have no commonalities. While a compression dictionary stores character strings, such as a maximum matching character string, for encoding that is not word sensitive, an analysis dictionary stores information containing words, parts of speech of words, subclassification of parts of speech, etc.

FIG. 4 illustrates an example of a compression dictionary used in LZ77 encoding, and FIG. 5 illustrates an example of a compression dictionary used in LZ78 encoding. As illustrated in FIG. 4 and FIG. 5, character strings in a compression dictionary are often segmented in the middle of a word and information of words is not held, making it difficult to associate character strings in a compression dictionary with a semantic analysis result.

In view of this situation, an arrangement may be possible in which words of natural languages are used for character strings of compression dictionaries so that a compress process and a morphological analysis share dictionaries. Performing a morphological analysis and compression of words on the basis of one dictionary makes it possible to associate each word with the semantic analysis result of that word in their compressed state.

Figure 6:
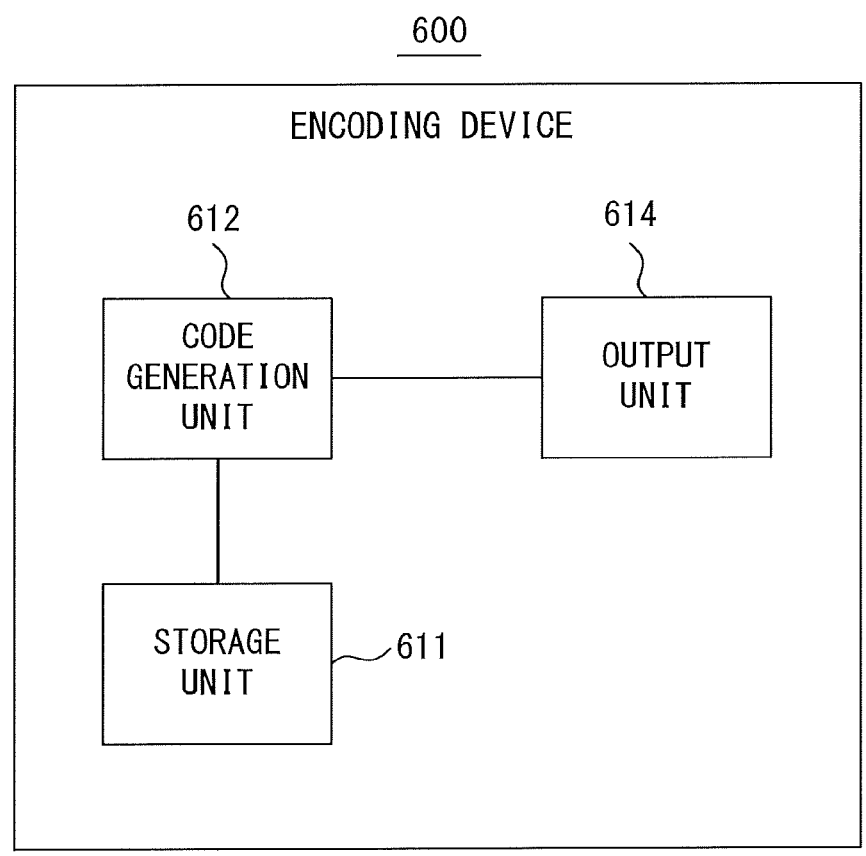
FIG. 6 illustrates a functional configuration example of an encoding device according to an embodiment.

FIG. 6 illustrates a functional configuration example of an encoding device according to an embodiment. An encoding device 600 illustrated in FIG. 6 includes a storage unit 611, a code generation unit 612 and an output unit 614.

The storage unit 611 may store for example a compression target document. The code generation unit 612 performs a compression process on a compression target document and performs a semantic analysis of the compression target document so as to perform a compression process on a semantic analysis result. The output unit 614 arranges the compression results and outputs them.

Figure 7:
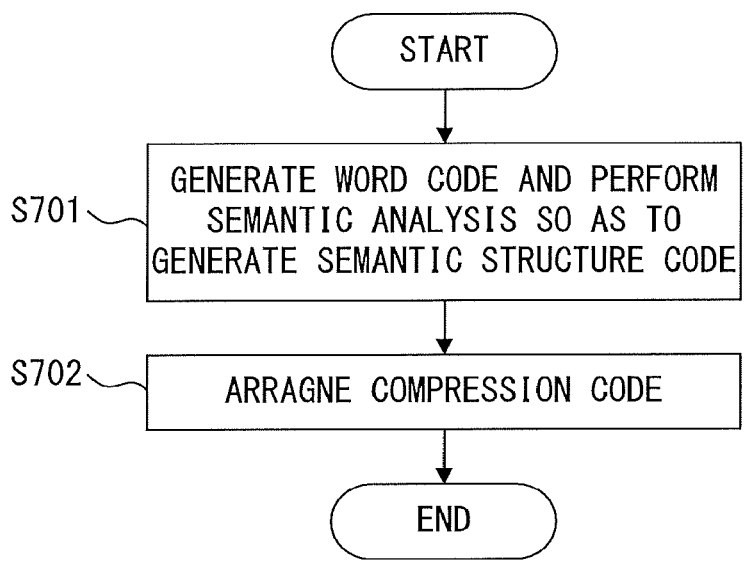
FIG. 7 is a flowchart explaining an example of an encoding process.

FIG. 7 is a flowchart explaining an example of an encoding process performed by the encoding device 600 illustrated in FIG. 6. In S701, the code generation unit 612 assigns compression codes to a plurality of words contained in a sentence in a compression target document, and performs a semantic analysis of the sentence so as to generate semantic structure information for each of the plurality of words. Semantic structure information may contain information representing for example a node in a graph structure and an arc from a higher-order node treating that node as the end point. Then, the code generation unit 612 assigns a compression code to each of the pieces of semantic structure information corresponding to the words.

In S702, the output unit 614 arranges in prescribed order and outputs the compression codes that were respectively assigned to the plurality of words and the pieces of semantic structure information. The encoding device 600 as described above can reduce process loads accompanied by utilizing a semantic analysis result of a document. Note that a semantic analysis may be performed by using a plurality of words contained in a sentence in a compression target document or may be performed by using a compression code assigned to each of a plurality of words contained in a sentence.

First Embodiment

Figure 8:
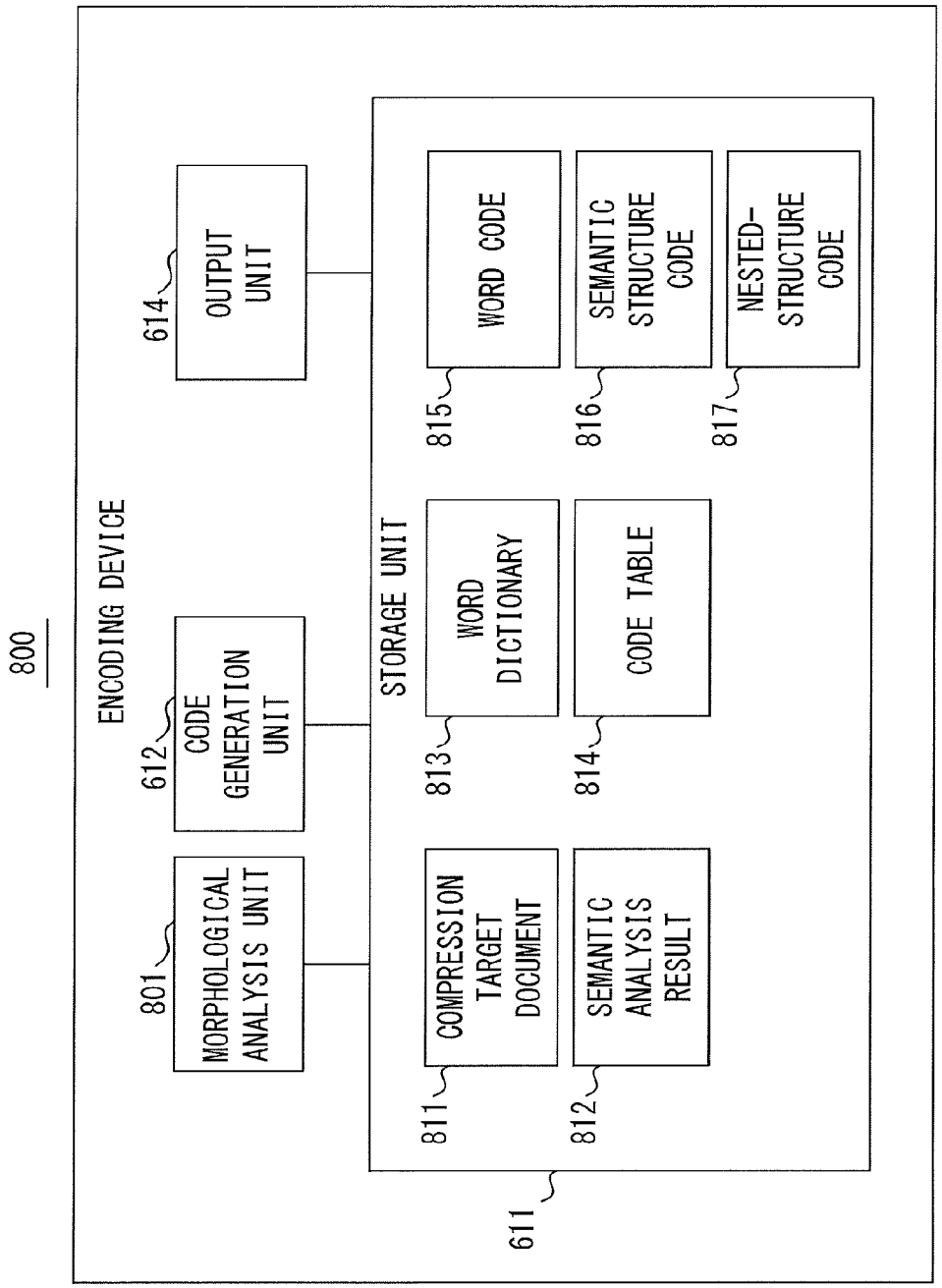
FIG. 8 exemplifies an encoding device according to a first embodiment.

FIG. 8 exemplifies an encoding device 800 according to the first embodiment. The encoding device 800 includes the storage unit 611, the code generation unit 612, the output unit 614 and a morphological analysis unit 801. When for example an encoding process starts, the storage unit 611 has stored a compression target document 811, a word dictionary 813, and a code table 814.

Figure 9:
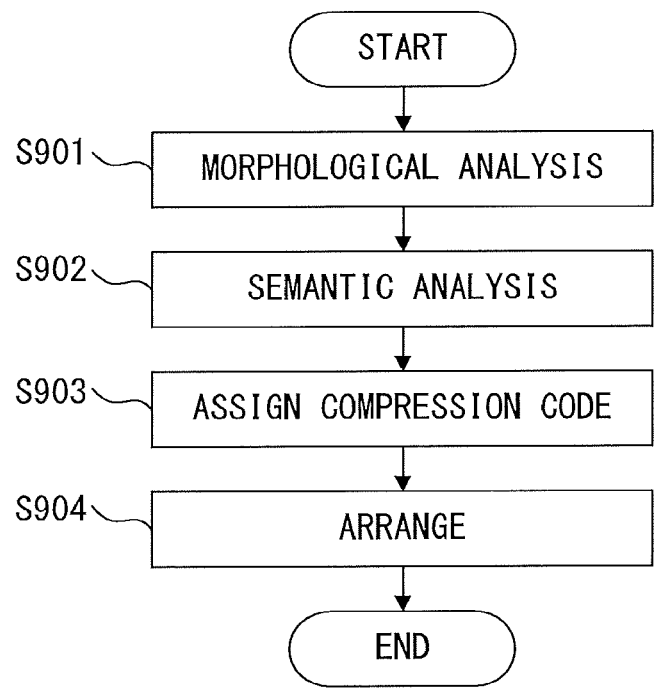
FIG. 9 is a flowchart of an encoding process according to the first embodiment.

FIG. 9 is a flowchart of an encoding process according to the first embodiment. The encoding process illustrated in FIG. 9 may be performed by for example the encoding device 800 illustrated in FIG. 8. In S901, the morphological analysis unit 801 uses the word dictionary 813 so as to perform a morphological analysis of the compression target document 811 so that a morpheme contained in each sentence in the compression target document 811 is extracted. Note that a morpheme obtained through a morphological analysis may be treated as a word.

FIG. 10 illustrates an example of the word dictionary 813. Each entry in the word dictionary 813 in FIG. 10 includes a word ID for identifying a word, the word and additional information. Additional information is information representing the attribute of the word, and may include for example information such as the part of speech, subclassification of the part of speech, utilization, etc. A plurality of pieces of additional information may be registered for one entry of the word dictionary 813. Note that subclassification of a part of speech is for example information resulting from further categorizing the part of speech. When for example a part of speech is nouns, the subclassification may include common nouns, proper nouns, numerals, etc. Further, additional information may include subclassification of a plurality of parts of speech for one word. For example, a proper noun may further be classified into more detailed levels such as a person's name, an organization's name, or a place name. The morphological analysis unit 801 compares the character strings of each sentence with the character string of each word registered in the word dictionary 813, and thereby can extract a corresponding word.

In S902, the code generation unit 612 performs a semantic analysis of each sentence by using a morphological analysis result so as to generate a semantic analysis result 812 to store it in the storage unit 611. Note that the semantic analysis result 812 may be in for example the graph structure illustrated in FIG. 2.

Figure 11:
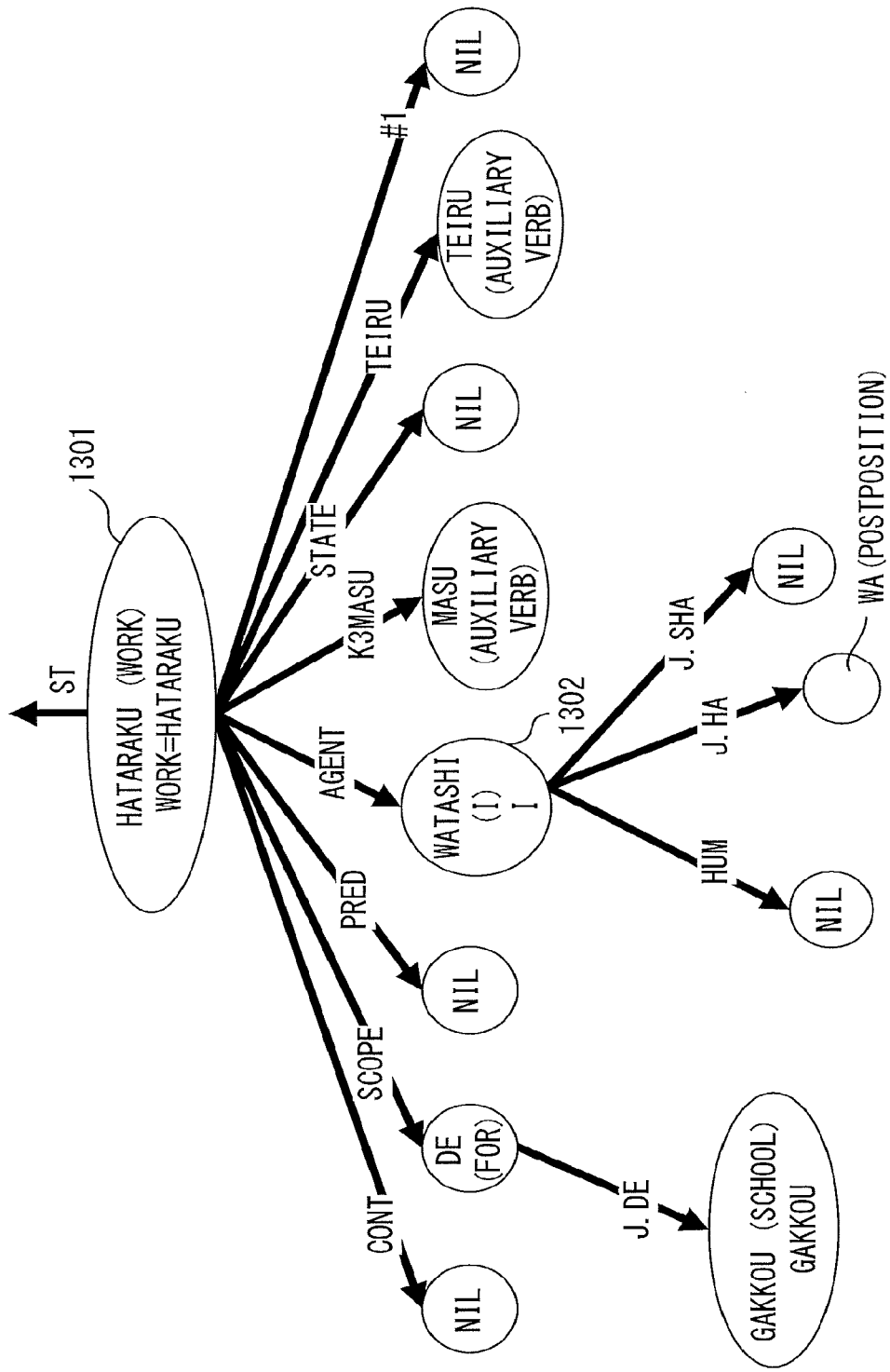
FIG. 11 exemplifies a tree structure that represents a semantic analysis result.

FIG. 11 exemplifies a tree structure obtained by converting the graph structure (as illustrated in FIG. 2 for example) that represents the semantic analysis result 812. A graph structure obtained from a semantic analysis result has a center node and does not have loops so that the structure can be converted into a tree structure as illustrated in FIG. 11. Note that a center node may be for example a predicate of a sentence. Also, in FIG. 11, an arc that is connected to just one node in the graph structure is assigned a void node (NIL) at an end of that arc on the side that is not connected to a node. Thereby, for example concept information, which represents the concept of a word, and an arc from a higher-order node treating that node as a terminal point, are associated with a node. Alternatively, when a node is a void node (NIL), an arc representing the attribute of a higher-order node for the void node is associated. Concept information may be for example information contained in additional information of the word dictionary 813 and may contain the subclassification of the part of speech of a word. FIG. 12 illustrates examples of pieces of concept information of words and examples of arcs. For example, in concept information of words, ADJ represents an adjective, ADV represents an adverb, and ADVP represents an adverbial phrase. Also, in arcs, "ST" for example is an arc that represents the origin (center node) of a graph structure. A word denoted by "ST" may be for example a predicate in a sentence. "AGENT" is for example an arc representing an agent.

Also, when the number of branches that a node has is not two in a tree structure obtained by converting a graph structure, a binary tree can be obtained by adding a dummy node. When for example one node has three or four branches, the structure can be converted into a binary tree by adding dummy nodes of one layer, and when one node has five through eight branches, the structure can be converted into a binary tree by adding dummy nodes of two layers.

Figure 13:
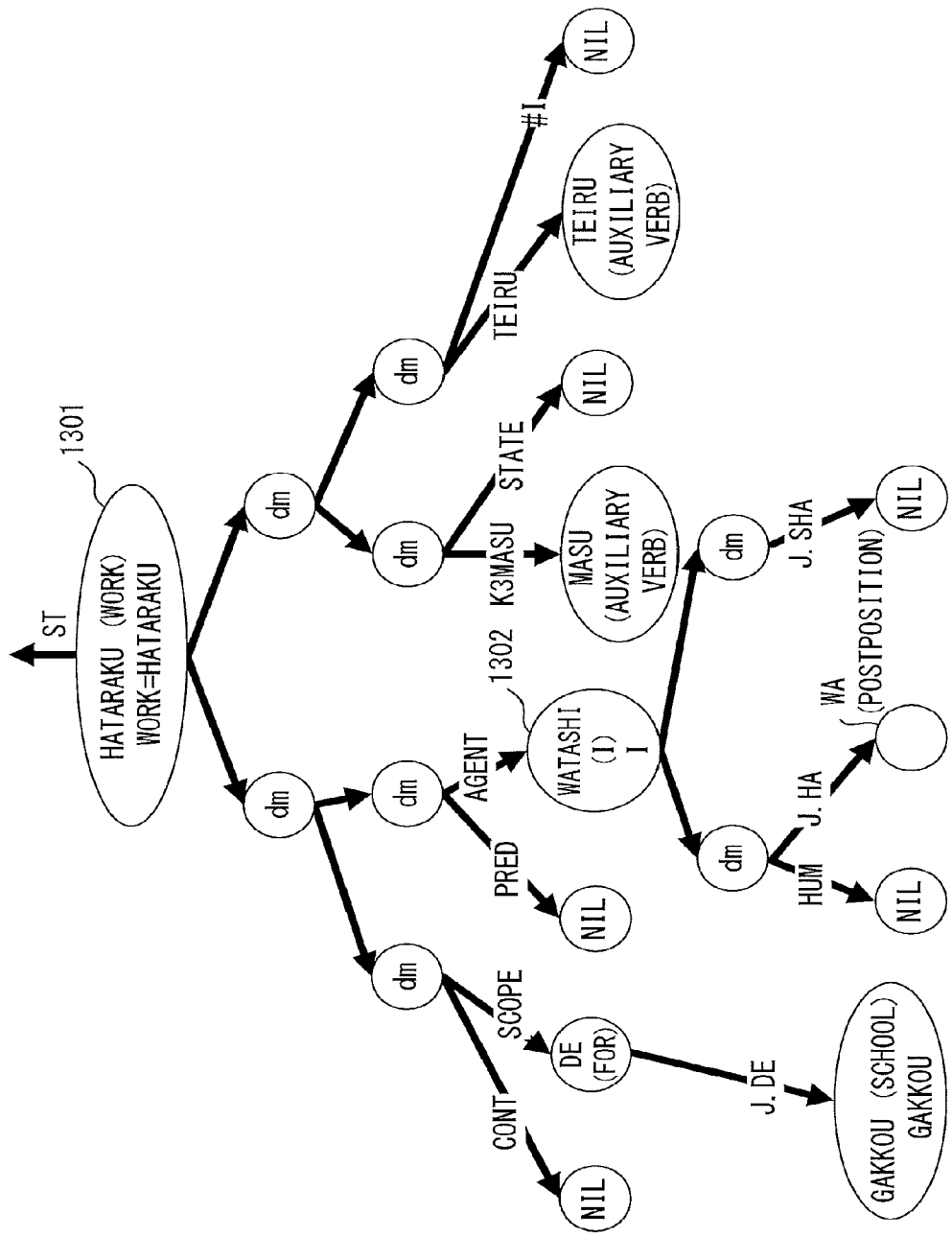
FIG. 13 exemplifies conversion of a semantic structure into a binary tree.

FIG. 13 exemplifies conversion of the semantic structure tree illustrated in FIG. 11 into a binary tree. Nodes 1301 and 1302, which have three or more branches in FIG. 11, have in FIG. 13 dummy nodes added to them so that the structure has been converted into a binary tree with each of the nodes having a reduced number of branches. As described above, the graph structure representing the semantic structure exemplified in FIG. 2 can be converted into a binary tree as illustrated in FIG. 13. Note that a binary tree obtained by converting a graph structure representing a semantic structure may also be referred to as a semantic structure binary tree hereinbelow.

Figure 14:
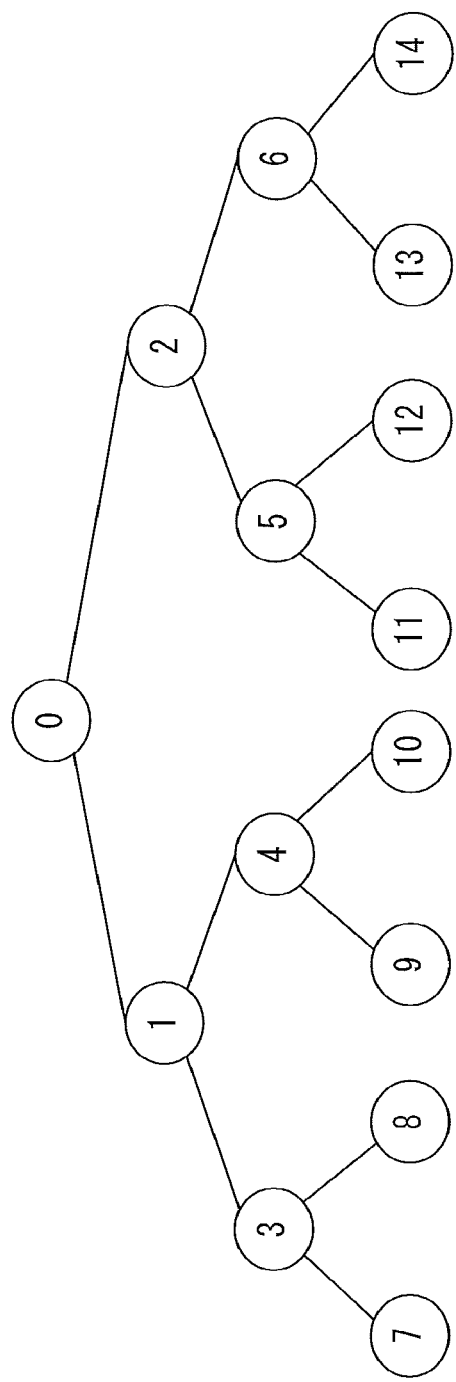
FIG. 14 exemplifies a basic structure of a binary tree.

Also, converting a graph structure representing a semantic structure into a binary tree makes it possible to represent a semantic structure binary tree by using a basic structure of a binary tree. FIG. 14 exemplifies the basic structure of a binary tree. The binary tree illustrated in FIG. 14 is a four-layer binary tree including 15 nodes of node 0 through node 14, the numbers of the nodes representing the positions of the nodes in the tree structure of the binary tree. By connecting, in a nested structure, a plurality of subtrees based on this basic structure of the binary tree, a binary tree having a deeper hierarchical structure can be generated. When a graph structure representing a semantic structure is converted into a binary tree, only a part of the resultant binary tree tends to be deep, and connecting another subtree to a leaf node of a subtree of a basic structure can reduce the ratio of unnecessary portions.

Figure 15:
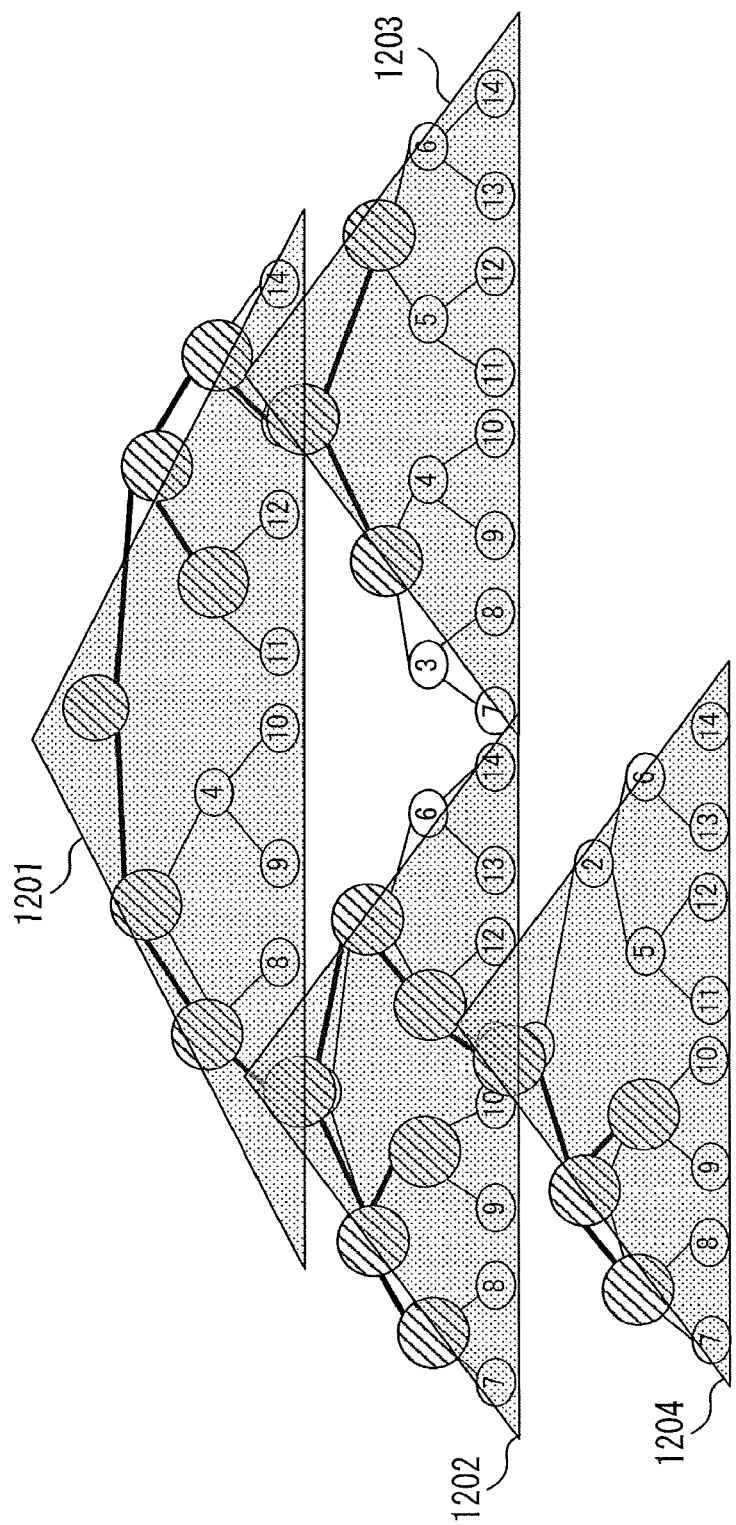
FIG. 15 exemplifies a semantic structure binary tree in which four subtrees are connected.

FIG. 15 illustrates an example of a semantic structure binary tree in which four subtrees are connected. A subtree 1202 and a subtree 1203 are child subtrees having a subtree 1201 as a parent, and a subtree 1204 is a child subtree having the subtree 1202 as a parent.

Root node 0 of the subtree 1202 is also functioning as leaf node 7 of the parent subtree 1201 and root node 0 of the subtree 1203 is also functioning as a leaf node 13 of the parent subtree 1201. Also, root node 0 of the subtree 1204 is also functioning as leaf node 11 of the parent subtree 1202.

Using these four subtrees makes it possible to describe for example a nine-layer binary tree including 19 nodes as below.

Subtree 1201: nodes 0 through 3, nodes 5 through 7 and node 13

Subtree 1202: nodes 1 through 5 and node 11

Subtree 1203: node 1 and node 2

Subtree 1204: node 1, node 3 and node 4

As described above, using a plurality of subtrees to express the tree structure of a semantic structure binary tree makes it possible to efficiently store, in the storage unit 611, a semantic structure binary tree in which only a portion has a deep hierarchical structure. In such a case, the semantic analysis result 812 includes nested-structure information, which represents a connection relationship between a parent subtree and a child subtree, together with semantic structure information corresponding to each branch of the semantic structure binary tree.

In S903, the code generation unit 612 refers to the word dictionary 813 and the code table 814 so as to assign a compression code to each word included in each sentence in the compression target document 811. Also, the code generation unit 612 assigns compression codes to semantic structure information and nested-structure information included in the semantic analysis result 812 in accordance with for example a prescribed rule. Then, the code generation unit 612 stores, in the storage unit 611, compression codes assigned to a word, semantic structure information and nested-structure information as a word code 815, a semantic structure code 816 and a nested-structure code 817, respectively.

The code table 814 registers association relationships between words and compression codes. A fixed-length code of 1 through 5 bytes may be used for a compression code. Examples of such compression codes are described below by using hexadecimal numbers.

Alphanumeric characters: 00h through 7Fh (1 byte)

CJK compatibility ideograph characters: A00000h through AFFFFFh (3 bytes)

English words: B00000h through B7FFFFh (3 bytes)

English collocations: B8000000h through BFFFFFFFh (4 bytes)

Japanese words: C00000h through C7FFFFh (3 bytes)

Japanese collocations: C8000000h through CFFFFFFFh (4 bytes)

Words of a third language: D00000h through D7FFFFh (3 bytes)

Collocations of a third language: D8000000h through DFFFFFFFh (4 bytes)

4-digit value: E00000h through E3FFFFh (3 bytes)

6-digit value: E4000000h through E4FFFFFFh (4 bytes)

9-digit value: E500000000h through E8FFFFFFFFh (5 bytes)

Semantic structure information and nested-structure information: F000000000h or greater (5 bytes)

Compression codes assigned to 4-digit or 6-digit values may have a code for distinguishing options for numerical expressions such as whether or not "," is added for every three digits of a decimal value, whether the value is a positive number or a negative number, and other factors.

A 3-byte through 5-byte compression code assigned to a word, semantic structure information, and nested-structure information has its 4 highest-order bits used for identifying the code type. For example, "C" represents a Japanese word and "F" represents semantic structure information and nested-structure information. The other bits are used for identifying an individual word, semantic structure information or nested-structure information.

The above compression code is just an example and a different method may be used for assigning a compression code to a word. A compression code may be a fixed-length code of a different size or may be a variable-length code.

FIG. 16 illustrates an example of the code table 814. Each entry in the code table 814 illustrated in FIG. 16 includes for example an ID for identifying a word and a compression code. A word ID illustrated in FIG. 10 is used for an ID of a word. For example, the compression code of the word "SAKURA (cherry)" corresponding to word ID "1" is "C01234h".

The code generation unit 612 replaces a word with a compression code that corresponds to the word on the code table 814, and thereby can generate the word code 815. It is also possible to manage the information in the word dictionary 813 and the information in the code table 814 collectively.

Also, the code generation unit 612 assigns compression codes to semantic structure information and nested-structure information in accordance with for example a prescribed rule, and thereby can generate the semantic structure code 816 and the nested-structure code 817. Semantic structure information and nested-structure information may be encoded in such a manner that they will include for example the information below.

In an embodiment, a 5-byte compression code assigned to semantic structure information has its 4 highest-order bits used for identifying the code type. The other bits, i.e., the lower 36 bits, are used as described below.

4 bits: numbers of nodes in a binary tree of a basic structure 8 bits: ID of a binary tree including nodes 12 bits: concept information of a word represented by a node 12 bits: arc (connection information) representing a connection relationship with a higher-order node.

Also, a 5-byte compression code assigned to nested-structure information has its 4 highest-order bits used for identifying the code type. The other bits, i.e., the lower 36 bits, are used as below.

4 bits: numbers of nodes in a binary tree of a basic structure 8 bits: ID of a binary tree including nodes 12 bits: ID of child binary tree 12 bits: code representing connection between trees FIG. 17 exemplifies compression codes assigned to the 12 highest-order or lowest-order bits among the 24 lowest-order bits of a compression code for semantic structure information and nested-structure information. In the example illustrated in FIG. 17, 0xAAA" and "0x085" are respectively assigned to "WORK=HATARAKU" and "I", which are concept information of words. Also, 0x001" and "0x0BC" are respectively assigned to "ST" and "AGENT" representing arcs. Note that "ST" is for example an arc representing the origin of a graph structure. "AGENT" is an arc representing for example an agent. A code equal to or greater than "0xF01" is assigned to the ID of a child binary tree of nested-structure information.

Figure 18:
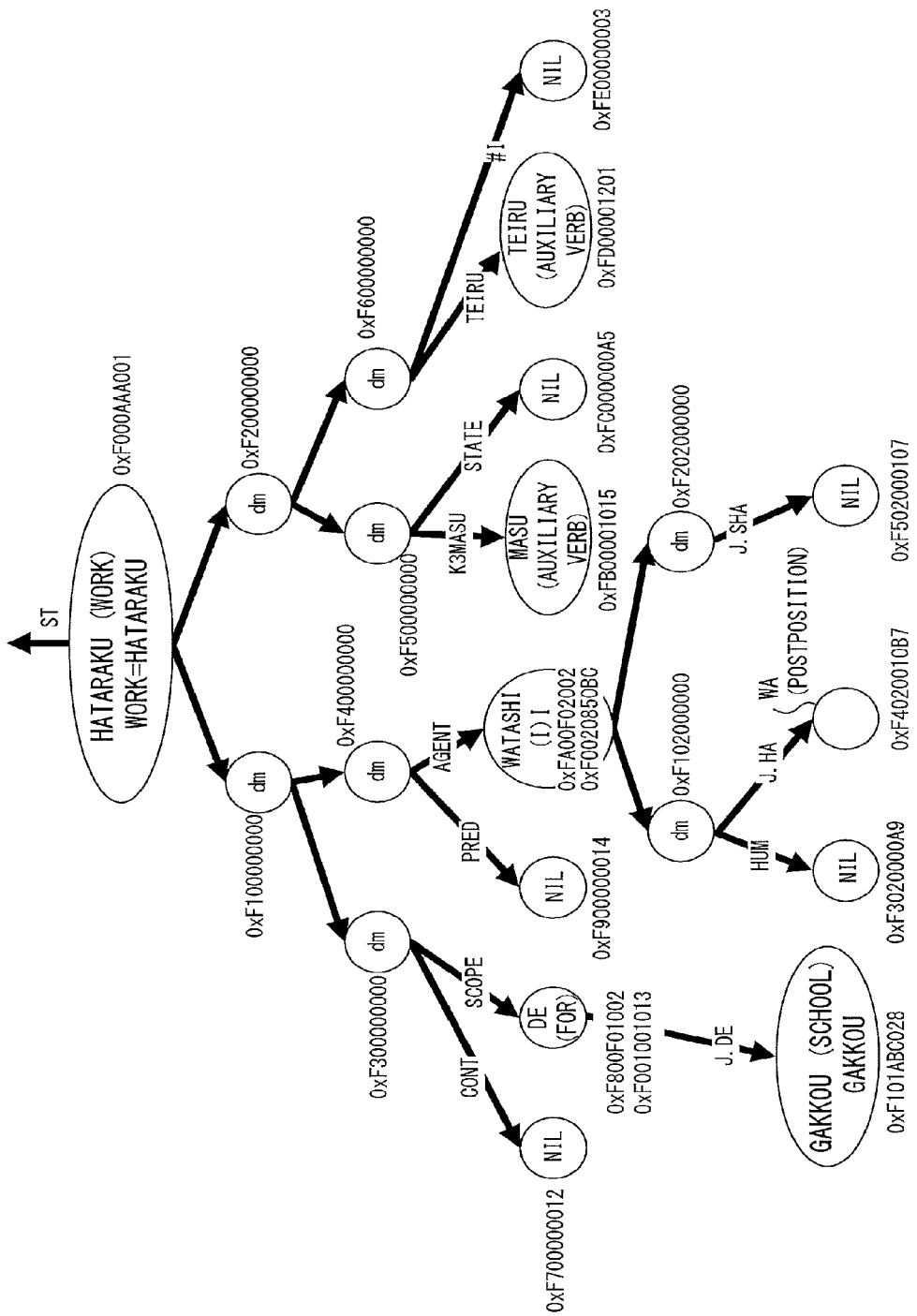
FIG. 18 exemplifies assignment of compression codes to semantic structure information and nested-structure information of a semantic structure binary tree.

FIG. 18 exemplifies compression codes assigned to semantic structure information and nested-structure information of the semantic structure binary tree illustrated in FIG. 13. The semantic structure binary tree illustrated in FIG. 18 has root nodes 0 of child binary trees connected to the respective positions of leaf nodes 8 and 10 of parent binary trees. "0x00" is assigned to the ID of a parent binary tree at 8 bits, which represents a binary tree including nodes of semantic structure information. "0x01" is assigned, at 8 bits, which represents the ID of a binary tree including nodes in semantic structure information and nested-structure information, to the ID of the child binary tree that is connected to leaf node 8. Also, "0xF01" is assigned at 12 bits, which represents a child node of nested-structure information. Similarly, "0x02" is assigned, at 8 bits, which represents the ID of a binary tree including nodes in semantic structure information and nested-structure information, to the ID of the child binary tree that is connected to leaf node 10. At 12 bits, which represents the ID of a child binary tree of nested-structure information, "0xF02" is assigned to the ID of a child binary tree that is connected to leaf node 10.

Also, for example, a semantic structure code of "0xF000AAA001" is assigned to the semantic structure information of root node 0 of a parent binary tree. The semantic structure code of "0xF000AAA001" has the first "F" (4 bits) representing semantic structure information, has the next "0" (4 bits) representing the number of node 0 in the binary tree and has the next "00" (8 bits) representing the ID of the binary tree including the node. Further, the next "AAA" (12 bits) represents the concept information of the word "WORK=HATARAKU". Also, the "001" (12 bits) at the tail represents arc:ST.

A semantic structure code of "0xF100000000" is assigned to the semantic structure information of a dummy node of node 1. The semantic structure code of "0xF100000000" has its first "F" (4 bits) representing that it is semantic structure information, has the next "1" (4 bits) representing the number of node 1, and has the next "00" (8 bits) representing the ID of the binary tree including the node. The next "000" (12 bits) represents that it is a NIL node not including the concept information of a word, and the "000" (12 bits) at the tail represents that it is a dummy node not including an arc.

In leaf node 8 of a parent binary tree, semantic structure information and nested-structure information exist. Among them, a nested-structure code of "0xF800F01002" is assigned to the nested-structure information, and a semantic structure code of "0xF001001013" is assigned to the semantic structure information.

The nested-structure code of "0xF800F01002" of leaf node 8 of the parent binary tree has its first "F" representing that it is nested-structure information, has the next "8" representing the number of node 8, has the next "00" representing the ID of the binary tree including the node, and has the next "F01" representing the ID of the child binary tree. Also, "002" as a code representing nested-structure information, which represents connections between trees, is assigned to 12 bits at the tail.

Also, the semantic structure code of "0xF001001013" of leaf node 8 of the parent binary tree has the first "F" representing semantic structure information, has the next "0" representing the number of node 0 in the binary tree including the node, and has the next "01" representing the ID of the binary tree including the node. The next "001" is a code representing a node that corresponds to a word, that however does not include the concept information of the word, and that is associated with the information of the notation. Also, the "013" at the tail represents arc: "SCOPE".

Similarly, in leaf node 10 of a parent binary tree, semantic structure information and nested-structure information exist. Among them, a nested-structure code of "0xFA00F02002" is assigned to the nested-structure information, and a semantic structure code of "0xF0020850BC" is assigned to the semantic structure information.

The nested-structure code of "0xFA00F02002" of leaf node 10 of the parent binary tree has the first "F" representing nested-structure information and has the next "A" representing the number of node 10. Also, the next "00" represents the ID of the binary tree including node, and the next "F02" represents the ID of a child binary tree. Also, "002" as a code representing nested-structure information, which represents connections between trees, is assigned to 12 bits at the tail.

Also, the semantic structure code of "0xF0020850BC" of leaf node 10 of the parent binary tree has the first "F" representing semantic structure information, has the next "0" representing the number of node 0 in the binary tree including the node, and has the next "02" representing the ID of the binary tree including the node. The next "085" is a code assigned to concept information of a word: "I". Also, the "0BC" at the tail is a code assigned to arc: AGENT.

As described above, the semantic structure code 816 and the nested-structure code 817 may be assigned to a node that connects two subtrees, and the semantic structure code 816 may be assigned to the other nodes.

In S904, the output unit 614 arranges the word code 815, the semantic structure code 816 and the nested-structure code 817 in a prescribed order for each sentence so as to generate a compression code string, and outputs the generated compression code string to for example an information processing apparatus that performs a utilization process. An example of a prescribed order may be the one below.

(1) First Order

Figure 19:
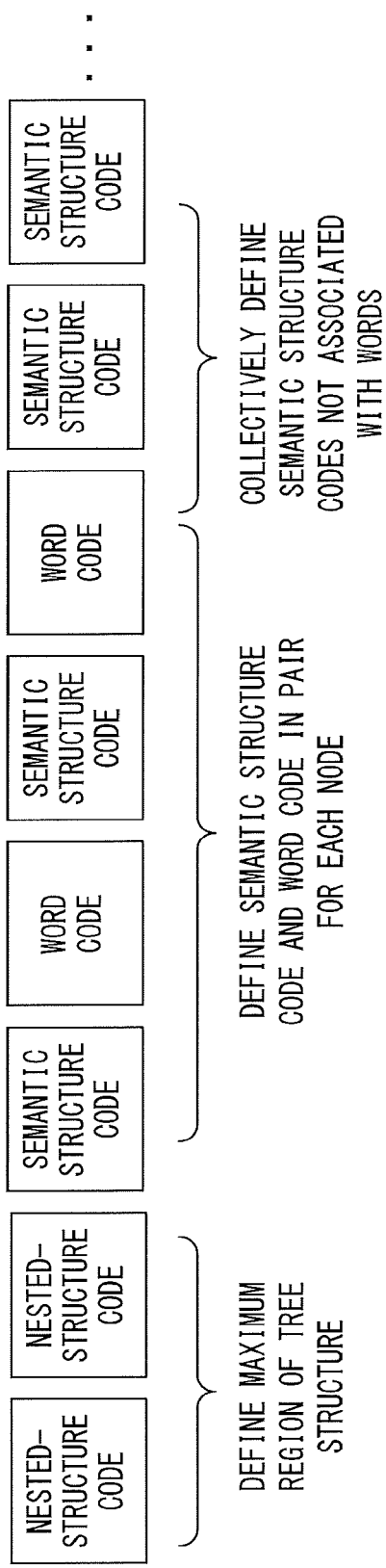
FIG. 19 illustrates an example of a compression code string arranged in a first order.

The word code 815 assigned to each word and the semantic structure code 816 assigned to the semantic structure information corresponding to that word are located for each sentence in such a manner that they are adjacent to each other. Note that the semantic structure code 816 for a NIL node or a dummy node that is not associated with a word may be arranged following for example a group resulting from arranging the word code 815 and the semantic structure code 816 assigned to the semantic structure information corresponding to that word. FIG. 19 illustrates an example of a compression code string arranged in the first order. Arranging a compression code in the first order makes it easy to associate each word with its semantic analysis result in a utilization process for utilizing a semantic analysis result.

(2) Second Order

Figure 20:
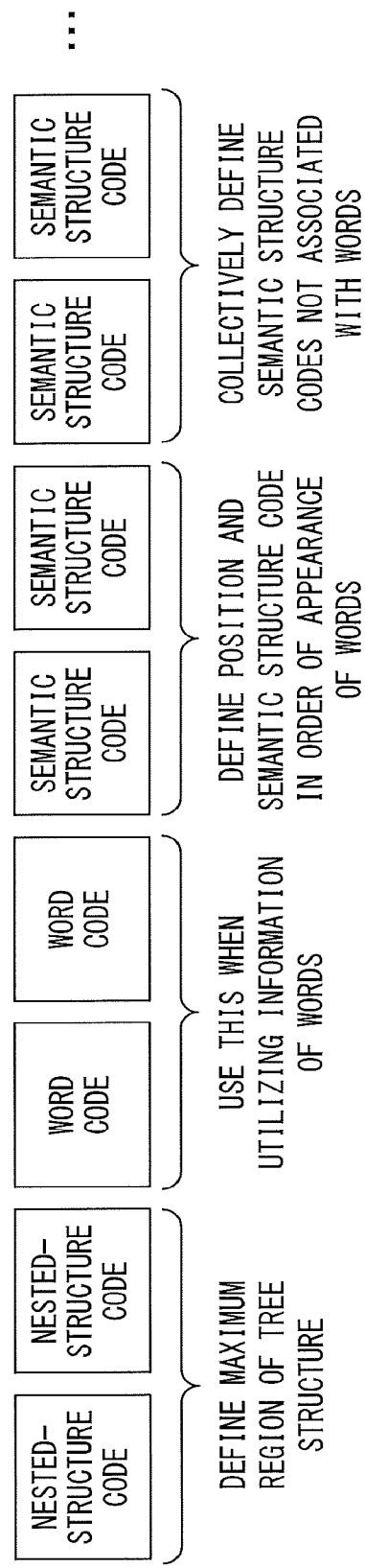
FIG. 20 illustrates an example of a compression code string arranged in a second order.

The plurality of word codes 815 assigned to a plurality of words are located for each sentence in such a manner that they are adjacent to each other. FIG. 20 illustrates an example of a compression code string arranged in the second order. This example collectively locates the word codes 815 first, and next locates the semantic structure codes 816 collectively, for each sentence. Arranging compression codes in the second order makes it possible to efficiently refer to word codes in a utilization process that only uses words. Note that the example illustrated in FIG. 20 arranges the semantic structure codes 816 corresponding to words in order of appearance of the words, and arranges semantic structure codes 816 corresponding to a NIL node or a dummy node that is not associated with a word following the above arranged semantic structure codes 816.

The encoding process according to the first embodiment described above performs a morphological analysis and a semantic analysis upon compression. The utilization does not require a morphological analysis or a semantic analysis or does not require the decompression of a compressed document, which results in reduced calculation costs compared with a case where a morphological analysis and a semantic analysis are performed after the decompression of a compressed document. Also, large effects are expected when for example an information processing apparatus having a small amount of computation resources such as a mobile terminal is to be used for utilizing compression data containing a semantic analysis result that is obtained by performing a morphological analysis, a semantic analysis, and data compression in a cloud environment having a large amount of computation resources.

Also, in recent years, the computation speeds of processors have drastically increased compared with the speeds of reading and writing of data from/to storage devices such as hard disks etc. This has increased cases where compression is performed in order to suppress the data amounts upon for example reading and writing of data from/to storage devices. Also, when for example a compression process and a semantic analysis process are performed separately, writing of data to the storage device occurs separately in each of the processes. By contrast, the above embodiment performs a series of processes including a morphological analysis, a semantic analysis, etc. when data is read from a storage device to be compressed. This only needs a data writing process to be performed once, improving a process speed in terms of a whole process including compression and a semantic analysis.

Note that the operation flow illustrated in FIG. 9 describes an example in which the code generation unit 612 performs a semantic analysis by using a word contained in a morphological analysis result and thereafter assigns a code to the word and semantic structure information and nested-structure information. This makes it possible for a semantic analysis of an encoding process according to an embodiment to use for example an application for performing an existing semantic analysis. However, embodiments are not limited to this example. For example, a different embodiment may employ a configuration in which the code generation unit 612 performs a morphological analysis in S901 and assigns a compression code to a word contained in the morphological analysis result so as to generate the word code 815. Thereafter, the code generation unit 612 may perform a semantic analysis by using the word code 815 in S902. In such a case, in 903, the code generation unit 612 may assign a code to semantic structure information and nested-structure information contained in the semantic analysis result 812.

Second Embodiment

Figure 21:
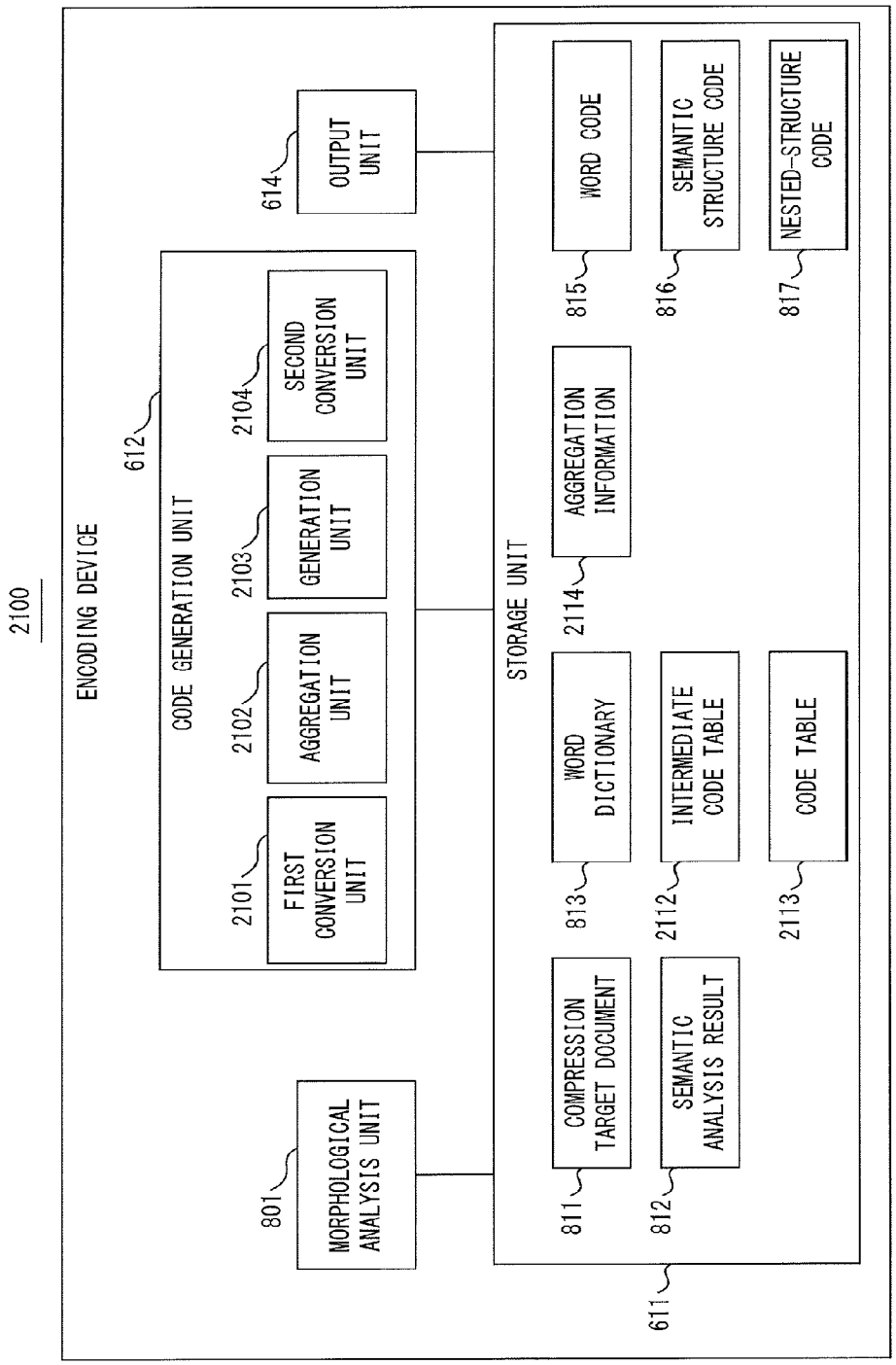
FIG. 21 illustrates an encoding device according to a second embodiment.

FIG. 21 illustrates an encoding device 2100 according to the second embodiment. The encoding device 2100 illustrated in FIG. 21 includes, similarly to the encoding device 600 illustrated in FIG. 6, the morphological analysis unit 801, the storage unit 611, the code generation unit 612 and the output unit 614. The code generation unit 612 includes a first conversion unit 2101, an aggregation unit 2102, a generation unit 2103, and a second conversion unit 2104. When for example an encoding process starts, the storage unit 611 has stored the compression target document 811, the word dictionary 813, and an intermediate code table 2112 that registers intermediate codes.

Figure 22:
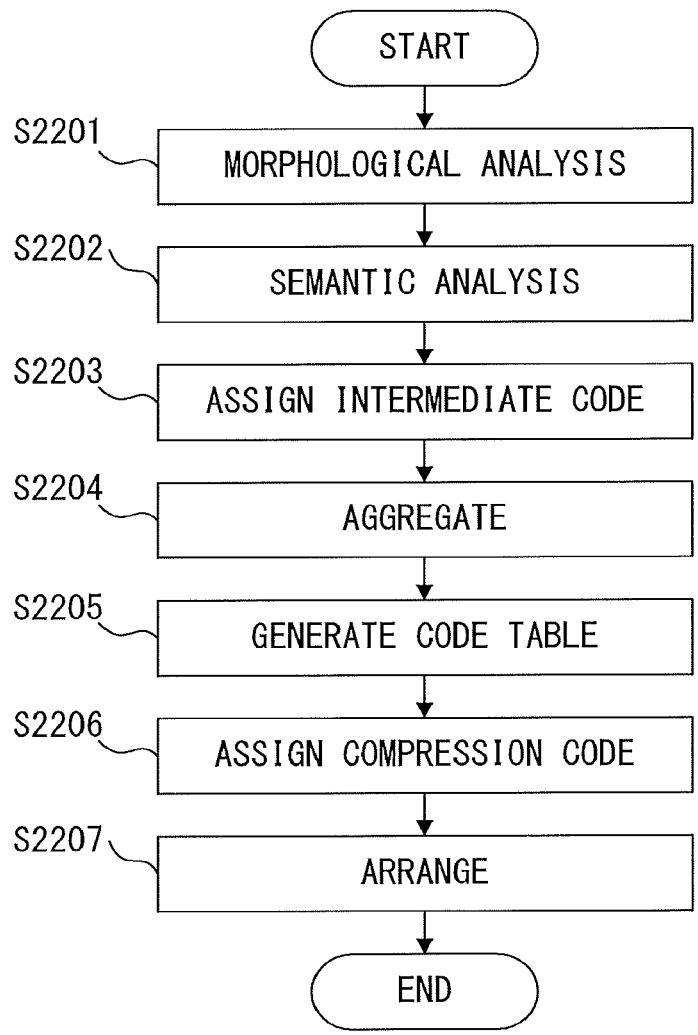
FIG. 22 is a flowchart of an encoding process according to the second embodiment.

FIG. 22 is a flowchart of an encoding process according to the second embodiment. The encoding process illustrated in FIG. 22 is performed by the encoding device 2100 illustrated in FIG. 21. In S2201 and S2202 in FIG. 22, the morphological analysis unit 801 and the code generation unit 612 in the encoding device 2100 may perform for example processes similar to those in S901 and S902 in FIG. 9.

Next, in S2203, the first conversion unit 2101 of the code generation unit 612 refers to the word dictionary 813 and the intermediate code table 2112 so as to assign an intermediate code to each word contained in each sentence in the compression target document 811.

FIG. 23 illustrates an example of the intermediate code table 2112. Each entry in the intermediate code table 2112 illustrated in FIG. 23 includes an ID for identifying a word and an intermediate code. A code similar to a compression code illustrated in FIG. 16 for example may be used as an intermediate code.

Further, the first conversion unit 2101 in S2203 assigns compression codes to semantic structure information and nested-structure information contained in the semantic analysis result 812 in S2202 in accordance with for example a prescribed rule, and thereby generates an intermediate code. Then, the first conversion unit 2101 associates the generated intermediate code with the ID so as to register them in the intermediate code table 2112, and also stores them in the storage unit 611. An ID that is not used as a word ID for example is used as an ID assigned to an intermediate code for semantic structure information and nested-structure information. The process in S2203 adds information that associates an intermediate code for semantic structure information and nested-structure information with the ID to the intermediate code table 2112 in addition to for example information that associates the ID of a word in the word dictionary 813 with an intermediate code.

In S2204, the aggregation unit 2102 counts the number of times that each intermediate code appears for an intermediate code assigned to each word contained in each sentence in the compression target document 811 and for an intermediate code assigned to semantic structure information and nested-structure information contained in the semantic analysis result 812. Then, the aggregation unit 2102 stores the counting result of intermediate codes in the storage unit 611 as aggregation information 2114. When a plurality of the compression target documents 811 are to be encoded, the number of times that an intermediate code appears may be counted for each document. Note that a configuration may be employed in which the aggregation unit 2102, upon counting, arranges an intermediate code assigned to each word and an intermediate code assigned to semantic structure information and nested-structure information contained in the semantic analysis result 812 in a prescribed order so as to generate an intermediate code string. Also, the aggregation unit 2102 may count the number of intermediate codes assigned to words contained in the intermediate code string and intermediate codes assigned to semantic structure information and nested-structure information.

FIG. 24 illustrates examples of a plurality of compression target documents 811, and FIG. 25 illustrates an example of the aggregation information 2114 for the plurality of compression target documents 811 of FIG. 24. Each entry in the aggregation information 2114 illustrated in FIG. 25 includes the document ID of the compression target document 811 and the number of times that each intermediate code assigned to the compression target document 811 appears. While FIG. 25 expresses intermediate codes by words, in actuality, for example IDs in the intermediate code table 2112 may be used for identifying intermediate codes of words, semantic structure information and nested-structure information.

For example, the compression target document 811 corresponding to document ID "1" contains one each of the words "SAKURA (cherry)", "GAKKOU (school)" and "NO (Japanese word like "of")", and does not contain the word "KAEDE (maple)". Also, the compression target document 811 corresponding to document ID "2" contains one each of the words "KAEDE", "GAKKOU" and "NO", and does not contain the word "SAKURA".

In S2205, the generation unit 2103 generates, on the basis of the aggregation information 2114, a code table 2113 in which a shorter compression code is assigned to information with a higher appearance frequency and a longer compression code is assigned to information with a lower appearance frequency. Then, the generation unit 2103 can obtain the number of times of appearance for each block of a prescribed size from the number of times of appearance for each document that is recorded in the aggregation information 2114 so as to generate the appropriate code table 2113 on the basis of the number of times of appearance of for each block.

FIG. 26 illustrates an example of the code table 2113 of compression codes. Each entry in the code table 2113 illustrated in FIG. 26 includes an ID for identifying a word, semantic structure information and nested-structure information, an intermediate code of the intermediate code table 2112, and a compression code assigned in S2205. Note that the information of the word dictionary 813 and the information of the code table 2113 may be managed in a collective manner.

In S2206, the second conversion unit 2104 refers to the word dictionary 813 and the code table 2113 so as to assign compression codes to each word contained in each sentence in the compression target document 811 and to semantic structure information and nested-structure information contained in the semantic analysis result 812. Then, the second conversion unit 2104 stores the compression codes assigned to the word, the semantic structure information and the nested-structure information in the storage unit 611 respectively as the word code 815, the semantic structure code 816 and the nested-structure code 817. Note that the compression codes in the code table 2113 assigned to the word, the semantic structure information, and the nested-structure information are herein referred to respectively as the word code 815, the semantic structure code 816, and the nested-structure code 817. However, embodiments are not limited to this example. For example, intermediate codes that are associated with a word, semantic structure information and nested-structure information in the code table 2113 may also be used as the word code 815, the semantic structure code 816 and the nested-structure code 817.

In S2207, the output unit 614 arranges the word code 815, the semantic structure code 816 and the nested-structure code 817 in a prescribed order so as to generate a compression code string, and outputs the generated compression code string, the code table 2113 and the aggregation information 2114 to for example the storage unit 611. Alternatively in a different embodiment, the output unit 614 may output a compression code string, the code table 2113 and the aggregation information 2114 to for example an information processing apparatus that performs a utilization process. Examples of a prescribed order may include the first order or the second order that is described above.

The encoding process illustrated in FIG. 22 reduces the loads of utilization processes similarly to the encoding process illustrated in FIG. 9. Further, a compression code string of the compression target document 811, the code table 2113 and the aggregation information 2114 are output in an associated manner, making it possible to manage these pieces of information in a unified manner. Using the semantic analysis result 812 and the aggregation information 2114 together increases the accuracy and the speeds of the utilization process.

The second embodiment describes an example in which the code generation unit 612 performs a semantic analysis by using a word contained in a morphological analysis result and thereafter assigns codes to the word and semantic structure information and nested-structure information. This makes it possible for a semantic analysis of an encoding process according to an embodiment to use for example an application for performing an existing semantic analysis. However, embodiments are not limited to this example. For example, a different embodiment may employ a configuration in which the code generation unit 612 assigns a code to a word contained in a morphological analysis result so as to perform a semantic analysis by using the encoded word.

<Utilization Process>

Next, a utilization process of a compression code string generated by the above process will be exemplified.

First Utilization Example

In a first utilization example, a case will be exemplified in which a compression code string is utilized for extracting a synonym. A synonym may be for example a word that has a different word form but is used to have a similar meaning. For example, examples of synonyms may include, among others, a combination of "HON (book)" and "SHOMOTSU (volume)", a combination of "BYOUKI (illness)" and "YAMAI (disease)", a combination of "TATERU (set)" in a case of "BITTO WO TATERU (set a bit)" and "ONN SURU (turn on)" in a case of BITTO WO ONN SURU (turn on a bit). Then, a semantic analysis result contained in a compression code string can be utilized for extracting such a synonym from writing.

Figure 27:
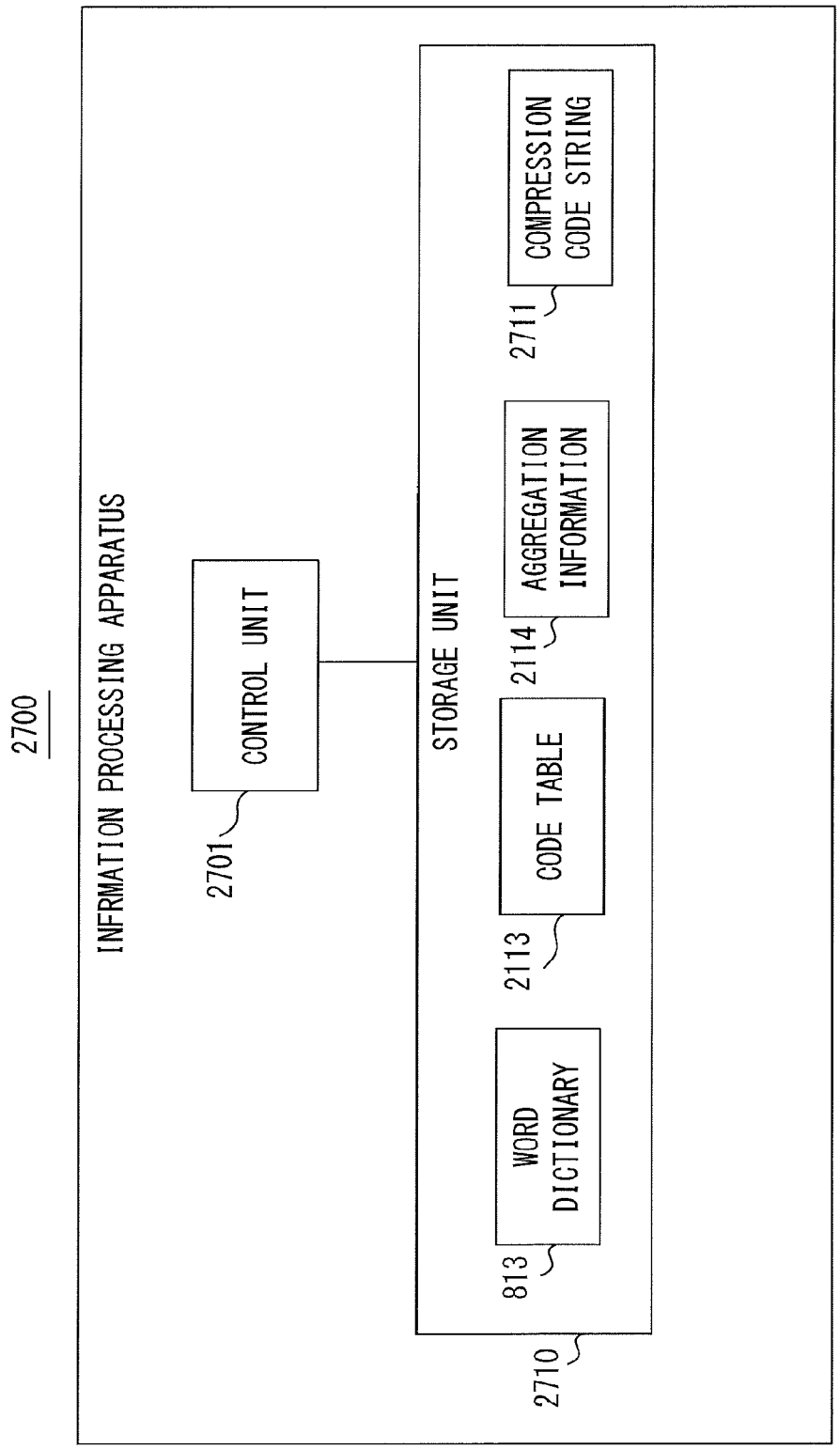
FIG. 27 illustrates a functional configuration example of an information processing apparatus that performs a utilization process.

FIG. 27 illustrates a functional configuration example of an information processing apparatus 2700 that performs a utilization process. The information processing apparatus 2700 may include for example a control unit 2701 and a storage unit 2710. The control unit 2701 may be implemented by for example a processor executing a program. Also, the storage unit 2710 of the information processing apparatus 2700 may be for example a memory. The storage unit 2710 in the information processing apparatus 2700 stores for example the word dictionary 813, the code table 2113, the aggregation information 2114 and a compression code string 2711. The compression code string 2711 may be for example information in which the word code 815, the semantic structure code 816, and the nested-structure code 817 that are output by the output unit 614 of the encoding device 2100 are arranged in a prescribed order. Also, the information processing apparatus 2700 may be for example the encoding device 2100 that generated the compression code string 2711.

Figure 28:
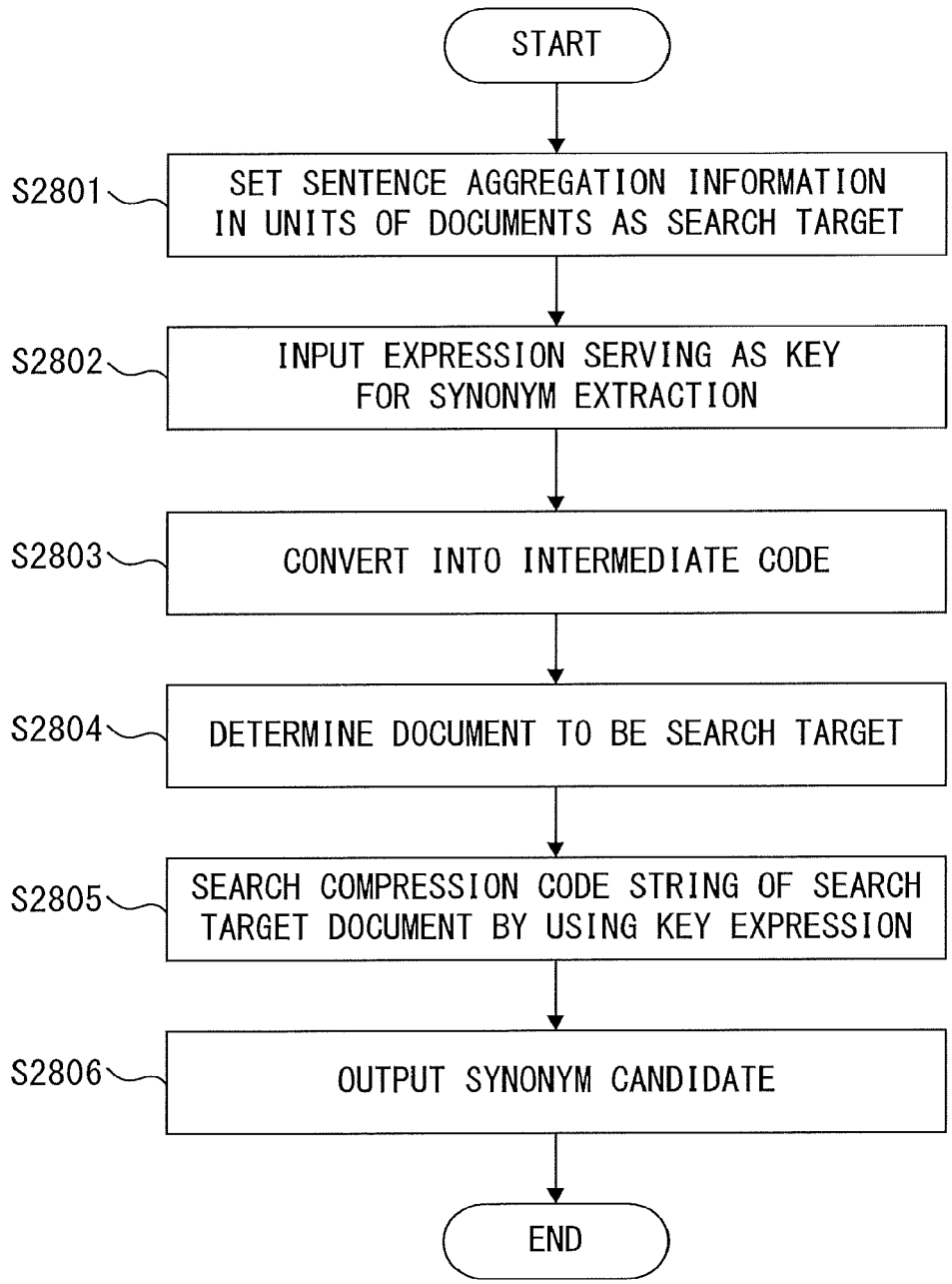
FIG. 28 exemplifies a flowchart in a case when a compression code string is utilized for extracting a synonym.

FIG. 28 exemplifies an operation flow in a case when the compression code string 2711 is utilized for extracting a synonym. In S2801, the control unit 2701 sets, as a search target, the aggregation information 2114 that has been aggregated in units of documents. In S2802, the control unit 2701 receives, from the user, for example input of an expression that serves as a key for the synonym extraction. Note that an expression that is input as a key may be in a form of for example a word, concept information of a word, a sentence containing an arc, or alternatively information related to a word, concept information of a word and an arc may be received as such an expression through user manipulation. Note that an expression that is input as a key is in a form of a sentence, and the control unit 2701 performs a semantic analysis of the input sentence, and thereby can obtain information such as a word, concept information of a word, an arc, etc. Also, an expression that is input as a key in this example may be an expression having a tendency to have its synonyms appearing often. An expression having a tendency to have its synonyms appearing often may be obtained by for example extracting an expression in writing in which a synonym registered in an existing thesaurus is utilized.

Next, in S2803, the control unit 2701 encodes an expression that is input as a key. For example, the control unit 2701 converts, into intermediate codes, a word, concept information of a word, and an arc contained in the expression that is input as a key. In other words, for example a word is converted into a word code, and concept information of a word and an arc are converted into a semantic structure code and a nested-structure code. Note for example that words may be interconverted with intermediate codes by the code table 2113 and that concept information of words and arcs may be interconverted with intermediate codes in accordance with a prescribed rule.

Next, in S2804, the control unit 2701 determines a document that is to be a search target, on the basis of the aggregation information 2114 and intermediate codes. For example, the control unit 2701 may refer to the aggregation information 2114 so as to determine, as a search target, a document containing a word code and a semantic structure code obtained by encoding an expression input as a key.

In S2805, the control unit 2701 uses an expression input as a key in S2802 so as to search the compression code string 2711 of a document determined to be a search target in order to extract a compression code string of a sentence containing the expression as a key. For example, the control unit 2701 may use the code table 2113 so as to convert the compression code of the compression code string 2711 into intermediate codes and generate an intermediate code string. Also, the control unit 2701 may search the generated intermediate code string in order to extract an intermediate code string corresponding to a sentence containing a word, concept information of a word, and an arc by using intermediate codes corresponding to a word, concept information of a word, and an arc contained in an expression that is input as a key.

In S2806, the control unit 2701 outputs, as a synonym candidate, a word having a possibility of being a synonym from an intermediate code string corresponding to an extracted sentence. For example, in an intermediate code string corresponding to an extracted sentence, the control unit 2701 identifies an intermediate code of a word connected to a word input as a key by an arc input as a key, on the basis of a semantic structure code and a nested-structure code that are encoded into the intermediate code string corresponding to the extracted sentence. Then, the control unit 2701 converts the identified intermediate code of a word into the word by using the word dictionary 813 and the code table 2113, and outputs the word as a synonym candidate. Note that in a different embodiment, the control unit 2701 may output a word that is still in a form of an intermediate code or may convert a word into a compression code to output it.

Figure 29:
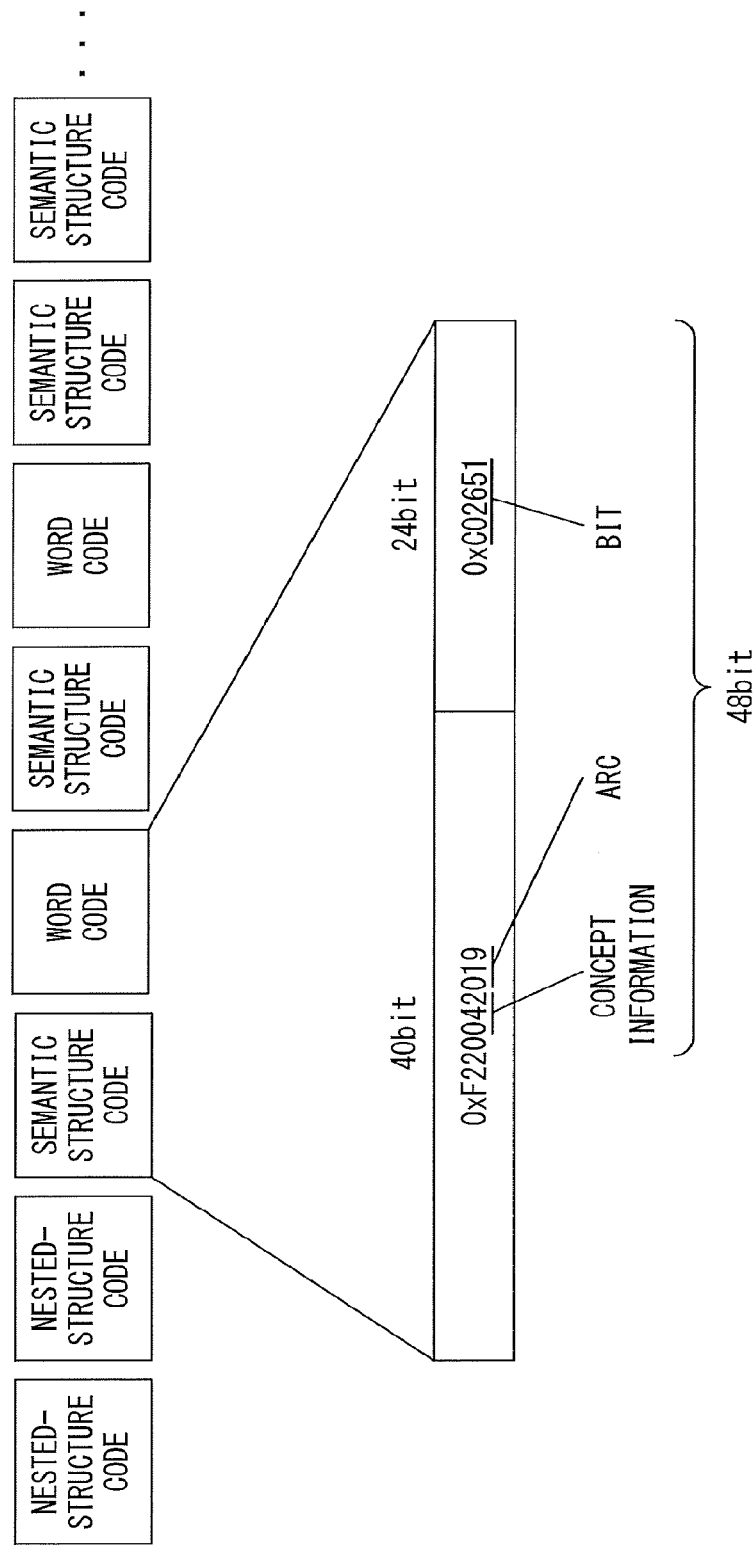
FIG. 29 illustrates an example of a synonym search.

FIG. 29 illustrates an example in which a search is performed for "set", which has the concept information of the word "UP" after the appearance of bit. Note that the example illustrated in FIG. 29 has replaced a compression code in the compression code string with an intermediate code by using the code table 2113. Also, instead of a search for the intermediate code of "0xC02651" (bit) of a word, a search has been performed for 48 bits of "0x04201902651" that is based on the last 24 bits of "0x042019" of an intermediate code of semantic structure information and the intermediate code of "0xC02651" (bit) of the word. By arranging the semantic structure code 816 and the word code 815 in series as described in FIG. 19, the control unit 2701 can perform a search in a compressed state on the basis of a combination between concept information and a word adjacent to that concept information. When for example a series of concept information, an arc, and a bit input as a key is detected as a result of searching, the control unit 2701 may output, as a synonym candidate, a word that is connected to a word:bit by an arc input as a key. Note that the control unit 2701 can increase the accuracy of synonym extraction by further confirming for example whether or not the concept information of an extracted word is concept information of "UP".

As described in FIG. 28 and FIG. 29, locating the semantic structure code 816 and the word code 815 in such a manner that they are adjacent to each other realizes high-speed detection of a word that corresponds to a particular semantic structure in a compression code string. Also, when a synonym is extracted on the basis of for example a juncture in a scope specified by using a scheme such as n-gram, one word sometimes has a plurality of qualifiers, resulting in a remote qualification relationship. However, because for example a semantic analysis locates nodes in qualification relationships adjacent to each other, a search can be performed for a word that is directly connected to a given word by an arc by using a semantic analysis result, resulting in high accuracy in the extraction of a synonym.

Second Utilization Example

The second utilization example exemplifies a case where the compression code string 2711 is utilized for knowledge extraction. It is possible to consider a case where knowledge is extracted for classifying questions from an article containing questions posted to a Q and A (Question and Answer) site and answers to them.

It is assumed for example that there is an answer of "system file of operating system or information necessary for activating hard disk may be damaged". In such a case, three pieces of knowledge that the article is about for example "OPERATINGU SISUTEMU NO SISUTEMU FAIRU (system file of operating system)", "HARDO DISUKU NO KIDOU (activation of hard disk)" and "JOUHOU NO HASON" (damage to information)" may be extracted from this sentence. Also, a semantic analysis result contained in the compression code string 2711 may be used for the extraction of for example these pieces of knowledge.

Figure 30:
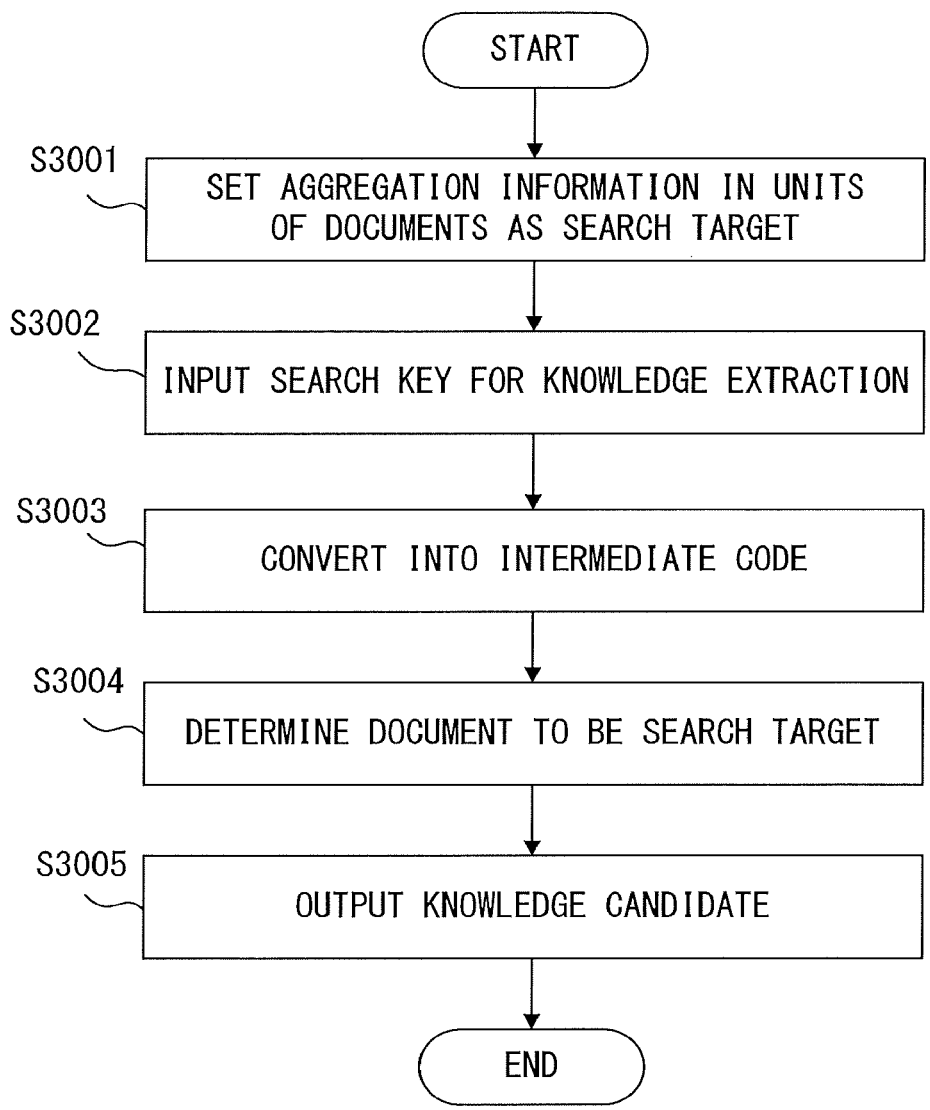
FIG. 30 exemplifies a flowchart in a case when a compression code string is utilized for knowledge extraction.

FIG. 30 exemplifies an operation flow in a case when a compression code string is utilized for knowledge extraction. In S3001, the control unit 2701 sets, as a search target, the aggregation information 2114 aggregated in units of documents. In S3002, the control unit 2701 receives the input of for example a search key for knowledge extraction from the user. Note that a search key may be received in a form of for example a sentence containing an arc often included in an expression that can be used as knowledge, or information related to an arc may be received as a search key through user manipulation. Also, a search key effective for the extraction of knowledge can be obtained by identifying an arc often included in knowledge on the basis of for example knowledge that has already been extracted or other information.

In S3003, the control unit 2701 converts an arc obtained from an input search key into an intermediate code in accordance with a prescribed rule.

Next, in S3004, the control unit 2701 determines a document that is to be a search target on the basis of the aggregation information 2114 and the intermediate code. For example, the control unit 2701 may determine, to be a search target, a document containing the intermediate code of an obtained arc, on the basis of the aggregation information 2114.

In S3005, the control unit 2701 searches, by an arc obtained from an input search key, the compression code string 2711 of a document determined to be a search target, and outputs, as a knowledge candidate, two words connected by the arc for which the search has been performed. For example, the control unit 2701 may use the code table 2113 to convert the compression code string 2711 of a search target document into an intermediate code string and identify an intermediate code string of a sentence containing an intermediate code corresponding to an input arc in the obtained intermediate code string. Further, the control unit 2701 identifies the intermediate codes of the two words connected by the arc in for example the identified intermediate code of a sentence on the basis of a semantic structure code and a nested-structure code that have been encoded into the identified intermediate code string corresponding to a sentence. Also, the control unit 2701 may convert the identified intermediate codes of two words into the words by using the code table 2113 and the word dictionary 813 so as to output it. Note that in a different embodiment, the control unit 2701 may output a word that is still in a form of an intermediate code or may convert a word into a compression code to output it. Also, for example the arc obtained from the search key and the two words that were output may be utilized as knowledge for classifying articles of Q and A.

Third Utilization Example

In the third utilization example, an example in which the compression code string 2711 is utilized for document revision is exemplified. For example, the information processing apparatus 2700 may utilize a semantic analysis result in order to prompt correction of a sentence in a case when writing contains a sentence that allows a plurality of interpretations.

For example, when there is a sentence "MEMORI A NI HYOUJISARERU MESSEIJI WO KAKUNOU SURU" ("A message that is displayed is stored in a memory"), it is not clear whether a message is displayed in memory A or a message is stored in memory A. In order to extract a sentence that tends to be ambiguous, a semantic analysis result contained in the compression code string 2711 can be utilized.

Figure 31:
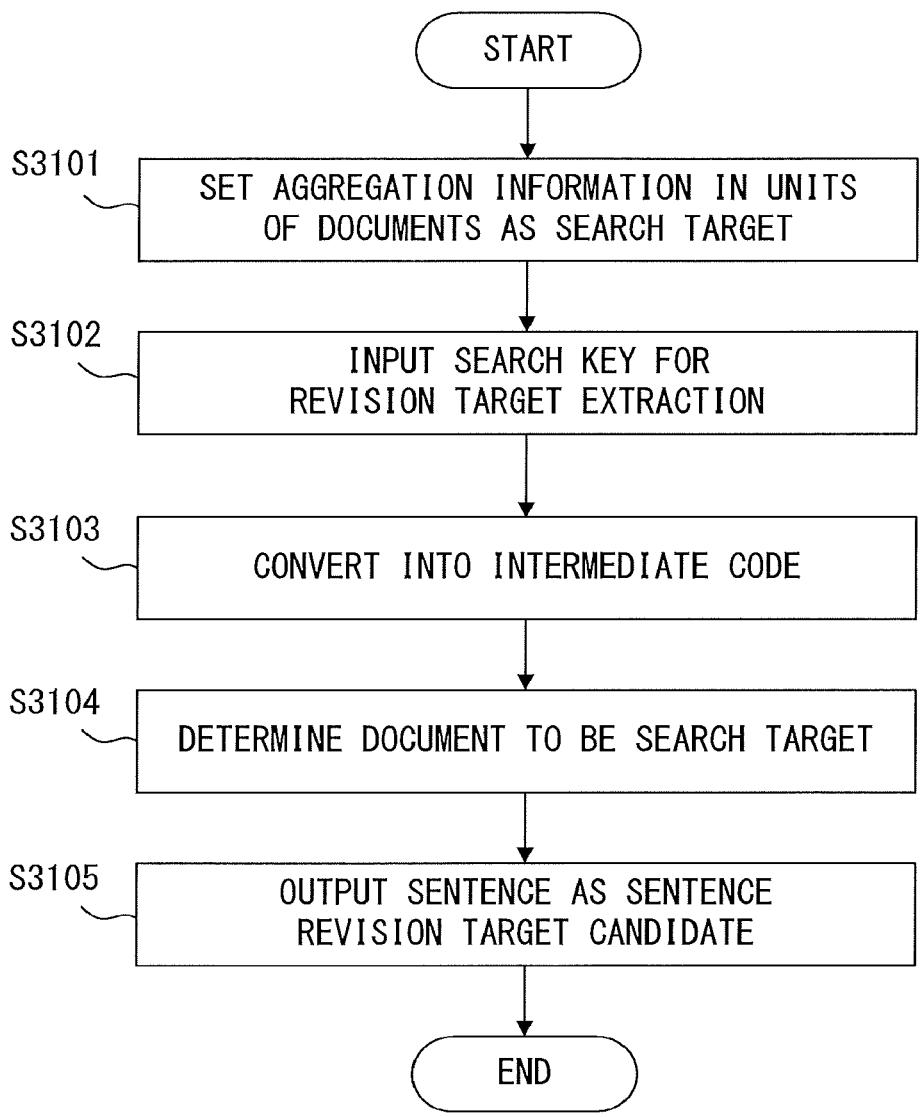
FIG. 31 exemplifies a flowchart in a case when a compression code string is utilized for sentence revision.

FIG. 31 exemplifies an operation flow in a case where the compression code string 2711 is utilized for sentence revision. In S3101, the control unit 2701 sets, to be a search target, aggregation information 2114 aggregated in units of documents. In S3102, the control unit 2701 receives, from the user, the input of a search key for extracting for example a sentence that is desirably to be revised. For example, an expression of a search key may be a series of a plurality of arcs. Note that an expression serving as a search key may be received in a form of for example a sentence containing a plurality of arcs of a prescribed series, or information related to a series of a plurality of prescribed arcs may be received through user manipulation. Also, a search key that is effective for extracting a sentence that is desirably to be revised can be obtained by identifying a series etc. of arcs that tend to give ambiguity to a sentence obtained from a plurality of existing sentences that are desirably to be revised.

In S3103, the control unit 2701 converts for example a plurality of arcs obtained from an input search key into intermediate codes in accordance with a prescribed rule.

Next, in S3104, the control unit 2701 determines a document that is to be a search target on the basis of the aggregation information 2114 and the intermediate codes. For example, the control unit 2701 may refer to the aggregation information 2114 so as to determine, to be a search target, a document containing intermediate codes corresponding to a plurality of arcs obtained from a search key.

In S3105, the control unit 2701 uses the code table 2113 to convert a compression code string of the document determined to be a search target into an intermediate code string. Then, the control unit 2701 searches the obtained intermediate code string of the document by using intermediate codes corresponding to a plurality of arcs that are arranged in a prescribed order and that were obtained from the expression serving as the search keys input in S3102. Then, the control unit 2701 identifies an intermediate code string of a sentence containing a plurality of arcs arranged in the prescribed order on the basis of the semantic structure code and the nested-structure code that were encoded into the intermediate code string of the document, and outputs the intermediate code string of the document. The output sentence may be for example a sentence that is highly likely to be a sentence that is desired to be revised and may be used for prompting the user to perform correction, etc. Note that the output sentence may be output in a form of an intermediate code or a compression code or may be decoded into the original word. The control unit 2701 may use the code table 2113 so as to perform conversion between words, intermediate codes and compression codes.

As exemplified in the first through third utilization examples above, the information processing apparatus 2700 can utilize a semantic analysis result in various processes by using for example the compression code string 2711 output from the encoding device 2100. Thereby, a semantic analysis does not have to be performed for utilization, leading to the reduction in the process loads of utilizing a semantic analysis result. Note that while the above utilization examples have exemplified a case where the scope of documents as search targets are narrowed effectively by using the aggregation information 2114, the utilization examples of the embodiments are not limited to them. For example, a different utilization example does not have to use the aggregation information 2114.

Variation Embodiment of First Utilization Example

The variation embodiment of the first utilization example exemplifies the utilization in the synonym extraction of the compression code string 2711 in a case when the aggregation information is not used. Note that in the variation embodiment, the storage unit 2710 in the information processing apparatus 2700 stores the code table 814 instead of the code table 2113, and does not have to store the aggregation information 2114. Also, the compression code string 2711 may be a compression code string that is output from the encoding device 800 according to the first embodiment.

Figure 32:
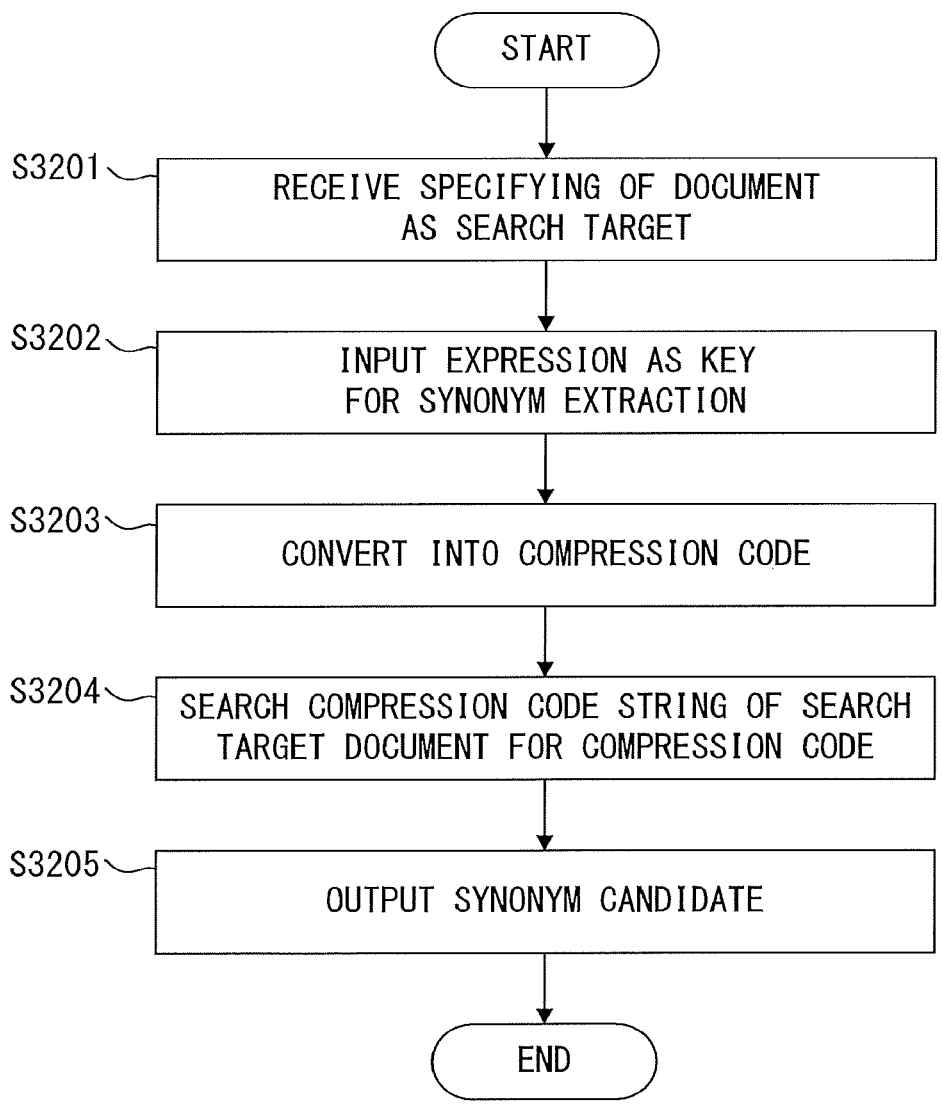
FIG. 32 exemplifies a flowchart for a variation embodiment in a case when a compression code string is utilized for synonym extraction.

FIG. 32 exemplifies an operation flow of the variation embodiment of the first utilization process that uses the compression code string 2711 for synonym extraction. In S3201, the control unit 2701 receives the specifying of a document that is a search target by the user. In S3202, the control unit 2701 receives from the user the input of for example an expression serving as a key for the synonym extraction. Note that an input expression serving as a key may be in a form of for example a sentence containing a word, concept information of a word and an arc, or information related to a word, and concept information of a word and an arc may be received as such an expression through user manipulation. Also, an expression that is input as a key may be an expression for which its synonyms appear often.

Next, in S3203, the control unit 2701 converts for example a word, concept information of a word, and an arc contained in an expression input as a key into corresponding compression codes by referring to the word dictionary 813 and the code table 814 or in accordance with a prescribed rule.

In S3204, the control unit 2701 searches the compression code string 2711 that is a search target specified in S3201 by using a compression code of an expression as a key converted in S3203, and extracts a compression code string of a sentence containing the expression as the key.

In S3205, the control unit 2701 outputs, as a synonym candidate, a word having a possibility of being a synonym from a compression code string of an extracted sentence. For example, the control unit 2701 identifies a word code of a word connected to a word input as a key, by an arc input as the key and on the basis of a semantic structure code and a nested-structure code encoded into a compression code string corresponding to the extracted sentence. Then, the control unit 2701 converts the identified word code into a word by using the word dictionary 813 and the code table 814 so as to output the resultant word as a synonym candidate. Note that in a different embodiment, the control unit 2701 may output a word that is still in a form of a word code.

As described above, in the variation embodiment of the first utilization example, the information processing apparatus 2700 can use for example the compression code string 2711 output from the encoding device 800 so as to use a semantic analysis result in various processes without decompression. Thereby, decompression or semantic analysis does not have to be performed for utilization, leading to the reduction in the process loads of utilizing a semantic analysis result.

Note that while the above examples explain cases of Japanese, the embodiments are not limited to them, and the embodiments may be applied to any other language including for example English, Chinese, etc.

The encoding devices 600, 800 and 2100 illustrated in FIG. 6, FIG. 8 and FIG. 21 and the information processing apparatus 2700 of FIG. 27 for performing a utilization process can be implemented by for example an information processing apparatus (computer) 3300 illustrated in FIG. 33.

The information processing apparatus 3300 illustrated in FIG. 33 includes a processor 3301, a memory 3302, an input device 3303, an output device 3304, an auxiliary storage device 3305, a medium driving device 3306 and a network connection device 3307. These constituents are connected to each other via a bus 3308.

The memory 3302 is for example a semiconductor memory such as a Read Only Memory (ROM), a Random Access Memory (RAM), a flash memory, etc. The memory 3302 stores a program and data for an encoding process or a utilization process. The memory 3302 may be used as for example the storage unit 611 illustrated in FIG. 6, FIG. 8 and FIG. 21 or as the storage unit 2710 illustrated in FIG. 27.

The processor 3301 executes a program by using for example the memory 3302 so as to operate as the code generation unit 612, the output unit 614 and the morphological analysis unit 801 illustrated in FIG. 6, FIG. 8 and FIG. 21 so as to perform an encoding process. The processor 3301 also operates as the first conversion unit 2101, the aggregation unit 2102, the generation unit 2103 and the second conversion unit 2104 illustrated in FIG. 21. Alternatively, the processor 3301 operates as the control unit 2701 illustrated in FIG. 27 by for example using the memory 3302 to execute a program so as to perform a utilization process.

The input device 3303 is for example a keyboard, a pointing device, etc., and is used for inputting instructions or information from the user or the operator. The output device 3304 is for example a display device, a printer, a speaker, etc., and is used for outputting inquiries or process results to the user or the operator. The process result may be a result of a utilization process.

The auxiliary storage device 3305 is for example a magnetic disk device, an optical disk device, a magnetooptical disk device, a tape device, etc. The auxiliary storage device 3305 may be a hard disk drive or a flash memory. The information processing apparatus 3300 may store a program and data in the auxiliary storage device 3305 so as to load them onto the memory 3302 to use them. The auxiliary storage device 3305 can be used as the storage unit 611 illustrated in FIG. 6, FIG. 8 and FIG. 21 or as the storage unit 2710 illustrated in FIG. 27.

The medium driving device 3306 drives a portable recording medium 3309 so as to access information recorded in it. The portable recording medium 3309 is for example a memory device, a flexible disk, an optical disk, a magnetooptical disk, etc. The portable recording medium 3309 may be a Compact Disk Read Only Memory (CD-ROM), a Digital Versatile Disk (DVD), a Universal Serial Bus (USB) memory, etc. The user or operator can store a program and data in the portable recording medium 3309 so as to load them onto the memory 3302 to use them.

As described above, a computer-readable recording medium having stored therein a program and data is a physical (non-transitory) recording medium such as the memory 3302, the auxiliary storage device 3305 and the portable recording medium 3309.

The network connection device 3307 is a communication interface that is connected to a communication network such as a Local Area Network (LAN), the Internet, etc. so as to perform data conversion for communications. The information processing apparatus may receive a program and data from an external device via the network connection device 3307 so as to load them onto the memory 3302 to use them. The network connection device 3307 enables for example the encoding devices 600, 800 and 2100 or the information processing apparatus 2700 for performing a utilization process to transmit and receive the code table 2113, the aggregation information 2114, a compression code string, etc.

Note that the information processing apparatus 3300 does not have to include all the constituents illustrated in FIG. 33, and some of them can be omitted in accordance with the purposes or conditions. For example, the input device 3303 can be omitted when the user or the operator does not input instructions or information, and the output device 3304 can be omitted when inquiries or process results are not output to the user or the operator. The medium driving device 3306 or the network connection device 3307 can be omitted when the information processing apparatus 3300 does not access the portable recording medium 3309 or a communication network.

As described above, the embodiments can reduce the process loads imposed when a semantic analysis result of a document is utilized.

While the embodiments of the disclosure and their advantages have been explained in detail, those skilled in the art will be allowed to make various changes, additions and omissions without departing from the scope of the present invention, which is clearly described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
    first generating a plurality of word codes by assigning a compression code to each of a plurality of words contained in a sentence in a compression target document;
    second generating a plurality of pieces of semantic structure information respectively corresponding to the plurality of words by performing a semantic analysis of the sentence;
    third generating a plurality of semantic structure codes by assigning each of the plurality of compression codes to corresponding semantic structure information; and
    outputting the plurality of word codes and the plurality of semantic structure codes with a specific order.

2. The non-transitory computer-readable recording medium according to claim 1, wherein
    the semantic structure information is generated by using the word code.

3. The non-transitory computer-readable recording medium according to claim 1, wherein
    the semantic structure information is generated by using the plurality of words.

4. The non-transitory computer-readable recording medium according to claim 1, wherein
    the prescribed order is an order by which the word code assigned to each word from among the plurality of words contained in the sentence is located in such a manner that the word code is adjacent to the semantic structure code corresponding to the word.

5. The non-transitory computer-readable recording medium according to claim 1, wherein
    the prescribed order is an order by which the word codes assigned to respective words from among the plurality of words contained in the sentence are located in such a manner that the word codes are adjacent toeach other.

6. An encoding device comprising:
    a processor that:
        generates a plurality of word codes by assigning a compression code to each of a plurality of words contained in a sentence in a compression target document;
        generates a plurality of pieces of semantic structure information respectively corresponding to the plurality of words by performing a semantic analysis of the sentence; and
        generates a plurality of semantic structure codes by assigning each of the plurality of a compression codes to corresponding semantic structure information; and
        outputting the plurality of word codes and the plurality of semantic structure codes with a specific order.

7. An encoding method performed by a computer, the method comprising:
    first generating, by a processor, a plurality of word codes by assigning a compression code to each of a plurality of words contained in a sentence in a compression target document;
    second generating, by the processor, a plurality of pieces of semantic structure information respectively corresponding to the plurality of words by performing a semantic analysis of the sentence; and
    third generating, by the processor, a plurality of semantic structure codes by assigning each of the plurality of compression codes to corresponding semantic structure information; and
    outputting the plurality of word codes and the plurality of semantic structure codes with a specific order.

8. A search method performed by a computer, the method comprising:
    converting, by a processor, a first arc, which represents a connection relationship between words, into a first compression code;
    searching, by the processor, a compression code string for the first compression code, the compression code string being obtained by arranging, in a prescribed order, word codes obtained by assigning compression codes respectively to a plurality of words contained in a sentence in a compression target document and semantic structure codes obtained by assigning compression codes to a plurality of pieces of semantic structure information respectively corresponding to the plurality of words obtained by performing a semantic analysis of the sentence.

9. The search method according to claim 8, wherein
    the prescribed order is an order by which the word code assigned to each word from among the plurality of words contained in the sentence is located in such a manner that the word code is adjacent to the semantic structure code corresponding to the word,
    the processor converts a word into a first word code, and
    the processor searches a compression code string in which the first word code and the first compression code are adjacent in the search for the first compression code.

10. The search method according to claim 8, wherein
    the prescribed order is an order by which the word codes assigned to respective words from among the plurality of words contained in the sentence are located in such a manner that the word codes are adjacent to each other.

11. The search method according to claim 8, wherein
    the processor further identifies a second word code from the compression code string by referring to a first semantic structure code corresponding to the first compression code in the compression code string.

12. The search method according to claim 8, wherein
the processor further converts a second arc, which represents a connection relationship between words, into a second compression code, and
the processor further searches for the second compression code in the search for the first compression code, and further identifies a compression code string of a sentence including a semantic structure containing the first arc and the second arc in a prescribed series from the compression code string by referring to a first semantic structure code corresponding to the first compression code and a second semantic structure code corresponding to the second compression code.

* * * * *